(12) United States Patent
Noto et al.

(10) Patent No.: US 10,516,209 B2
(45) Date of Patent: Dec. 24, 2019

(54) PHASED ARRAY ANTENNA DEVICE

(71) Applicant: Mitsubishi Electric Corporation, Tokyo (JP)

(72) Inventors: Hifumi Noto, Tokyo (JP); Nobuhiko Ando, Tokyo (JP); Hideyuki Nakamizo, Tokyo (JP); Morishige Hieda, Tokyo (JP); Hideki Morishige, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 263 days.

(21) Appl. No.: 15/561,472

(22) PCT Filed: Apr. 1, 2016

(86) PCT No.: PCT/JP2016/060945
§ 371 (c)(1),
(2) Date: Sep. 25, 2017

(87) PCT Pub. No.: WO2016/167145
PCT Pub. Date: Oct. 20, 2016

(65) Prior Publication Data
US 2018/0053997 A1 Feb. 22, 2018

(30) Foreign Application Priority Data
Apr. 13, 2015 (JP) .................. 2015-081628

(51) Int. Cl.
*H04B 1/04* (2006.01)
*H01Q 3/26* (2006.01)
(Continued)

(52) U.S. Cl.
CPC ............ *H01Q 3/2617* (2013.01); *H01Q 3/28* (2013.01); *H01Q 21/06* (2013.01); *H03F 1/32* (2013.01);
(Continued)

(58) Field of Classification Search
CPC . H03F 1/22; H03F 1/02; H03F 1/3241; H03F 1/565; H04B 1/04; H04B 2001/0425; H04B 1/0475
See application file for complete search history.

(56) References Cited

U.S. PATENT DOCUMENTS

| 5,999,826 A | 12/1999 | Whinnett |
| 2004/0085239 A1 | 5/2004 | Ukena et al. |

(Continued)

FOREIGN PATENT DOCUMENTS

| JP | H10-117162 A | 5/1998 |
| JP | 2002-190712 A | 7/2002 |

(Continued)

OTHER PUBLICATIONS

The extended European search report issued by the European Patent Office dated Oct. 19, 2018, which corresponds to EP16779936.0-1203 and is related to U.S. Appl. No. 15/561,472.

(Continued)

*Primary Examiner* — Tuan Pham
(74) *Attorney, Agent, or Firm* — Studebaker & Brackett PC

(57) ABSTRACT

Synthesizers (32, 24) for synthesizing feedback signals output from a plurality of antenna modules (4) are provided. A distortion compensation signal output unit (15) derives, from a difference between a feedback signal synthesized by the synthesizers (32, 24) and a base band signal output from a modulation unit (12), a distortion compensation coefficient that provides, to the base band signal, distortion characteristics opposite to distortion characteristics of a signal radiated from the phased array antenna and outputs a predistortion signal representing the distortion compensation coefficient to a PD unit (13).

6 Claims, 16 Drawing Sheets

(51) Int. Cl.
*H03F 1/32* (2006.01)
*H01Q 3/28* (2006.01)
*H01Q 21/06* (2006.01)

(52) U.S. Cl.
CPC ............. *H04B 1/04* (2013.01); *H04B 1/0458* (2013.01); *H04B 2001/045* (2013.01)

(56) References Cited

U.S. PATENT DOCUMENTS

| | | | |
|---|---|---|---|
| 2006/0133535 A1* | 6/2006 | Jung | H01Q 3/267 375/296 |
| 2010/0166109 A1 | 7/2010 | Neumann et al. | |
| 2011/0150130 A1 | 6/2011 | Kenington | |
| 2011/0235748 A1 | 9/2011 | Kenington | |
| 2013/0285742 A1* | 10/2013 | van Zelm | H03F 1/3247 330/149 |
| 2015/0215951 A1* | 7/2015 | McGowan | H04W 72/082 370/329 |

FOREIGN PATENT DOCUMENTS

| | | |
|---|---|---|
| JP | 2004-135263 A | 4/2004 |
| JP | 2006-067428 A | 3/2006 |
| JP | 2006-094043 A | 4/2006 |
| JP | 2010-232866 A | 10/2010 |
| JP | 2011-019029 A | 1/2011 |

OTHER PUBLICATIONS

International Search Report issued in PCT/JP2016/060945; dated May 10, 2016.
An Office Action; "Notice of Reasons for Refusal," mailed by the Japanese Patent Office dated Oct. 4, 2016, which corresponds to Japanese Patent Application No. 2016-549184.

* cited by examiner

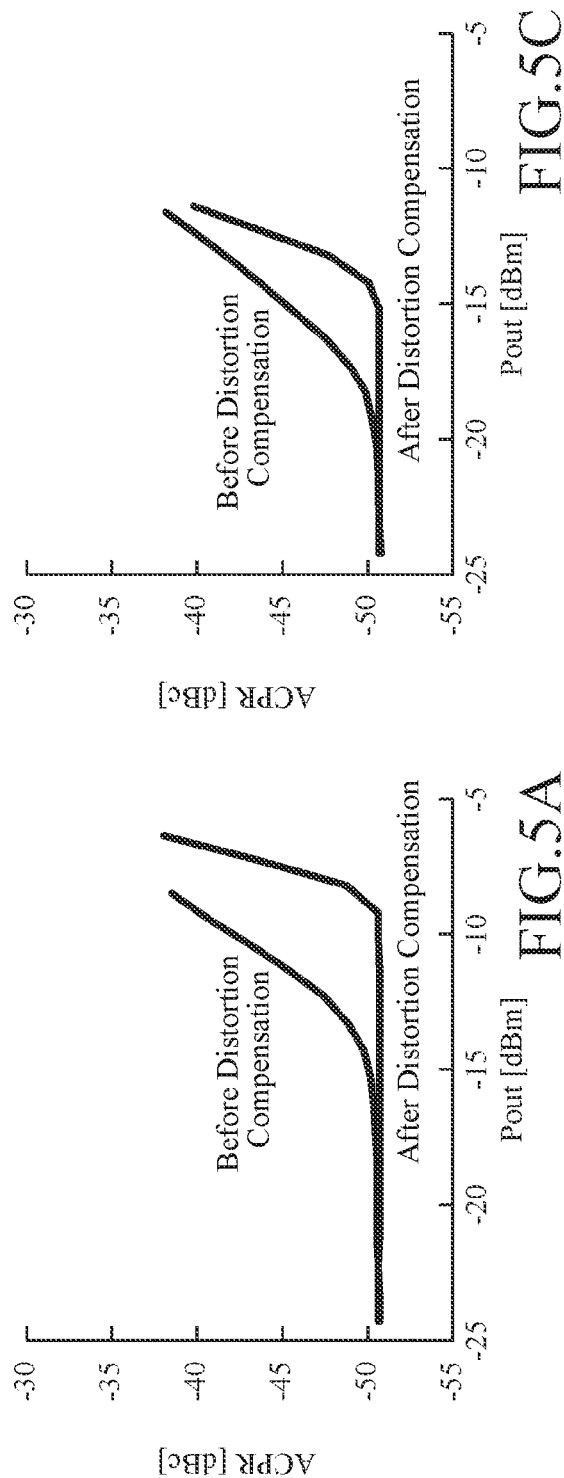
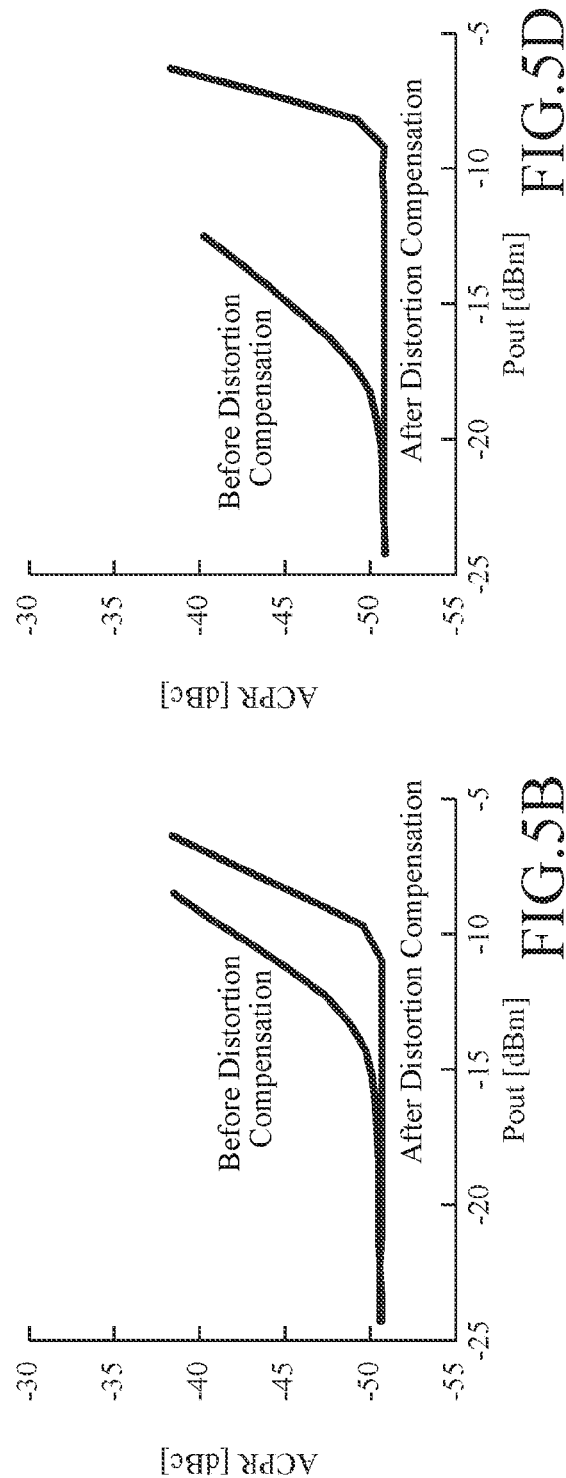

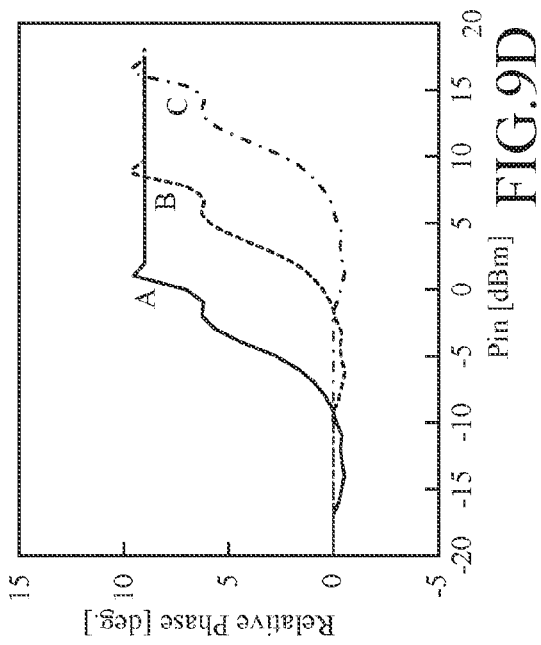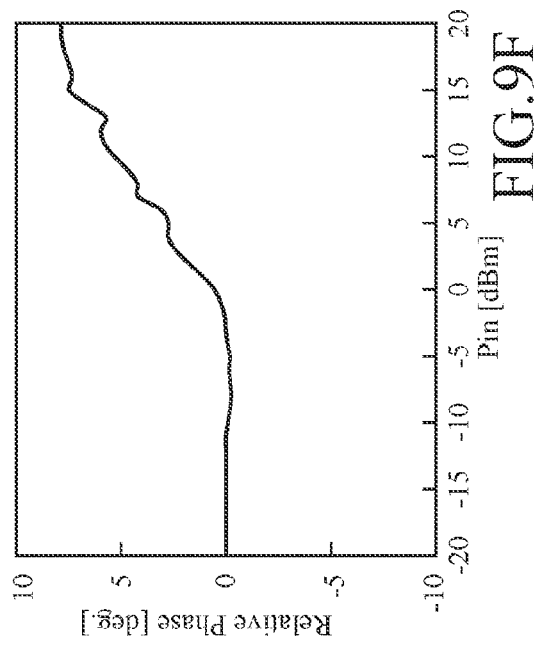

FIG.12

| Combination Number | Class A | Class B | Class B | Class C | Improvement Amount of B.O. | Deterioration Amount |
|---|---|---|---|---|---|---|
| (1) | ±2dB | ±2dB | ±2dB | ±2dB | 2.4dB | 4.3dB |
| (2) | ±1dB | ±1dB | ±1dB | ±1dB | 5.7dB | 1dB |
| (3) | ±0.5dB | ±0.5dB | ±0.5dB | ±0.5dB | 6.4dB | 0.3dB |
| (4) | ±2dB | | | | 2.5dB | 4.2dB |
| (5) | ±1dB | | | | 6.2dB | 0.5dB |
| (6) | ±0.5dB | | | | 6.5dB | 0.2dB |
| (7) | | ±2dB | ±2dB | | 5.1dB | 1.6dB |
| (8) | | ±1dB | ±1dB | | 6.4dB | 0.3dB |
| (9) | | ±0.5dB | ±0.5dB | | 6.6dB | 0.1dB |
| (10) | | | | ±2dB | 6.6dB | 0.1dB |
| (11) | | | | ±1dB | 6.6dB | 0.1dB |
| (12) | | | | ±0.5dB | 6.7dB | 0dB |
| (13) | ±2dB | ±2dB | ±2dB | | 2.4dB | 4.2dB |
| (14) | ±1dB | ±1dB | ±1dB | | 5.7dB | 0.9dB |
| (15) | ±0.5dB | ±0.5dB | ±0.5dB | | 6.4dB | 0.3dB |
| (16) | | ±2dB | ±2dB | ±2dB | 5dB | 1.7dB |
| (17) | | ±1dB | ±1dB | ±1dB | 6.3dB | 0.4dB |
| (18) | | ±0.5dB | ±0.5dB | ±0.5dB | 6.7dB | 0dB |

PHASED ARRAY ANTENNA DEVICE

TECHNICAL FIELD

This invention relates to a phased array antenna device having a function of compensating nonlinearity of a signal in a power amplifier that amplifies a modulated wave signal.

BACKGROUND ART

Regarding microwave transceiver apparatuses using a phased array antenna device, transmitters are not required to have linearity when used for radar purposes but are required to have linearity when used for communication purposes.

In microwave transceiver apparatuses using a phased array antenna device, it is required to downsize a transceiver module connected to each element antenna. Therefore, there is necessary to raise efficiency of a power amplifier included in a transceiver.

However, raising efficiency of a power amplifier generally results in larger nonlinearity, and as a result, distortion occurs.

Patent Literature 1 listed below discloses a technique for enhancing linearity of a microwave transceiver apparatus using a phased array antenna device.

That is, Patent Literature 1 discloses a technique for enhancing linearity of a microwave transceiver apparatus using a phased array antenna device by transmitting a microwave that is a transmission signal, then collecting a reception signal of the microwave as a feedback signal from a receiving terminal receiving the microwave, and performing distortion compensation processing on a transmission signal using the feedback signal.

Patent Literatures 2 to 6 listed below disclose techniques for enhancing linearity of an antenna module forming a phased array antenna device.

That is, Patent Literatures 2 and 4 disclose techniques for enhancing linearity of each antenna module by switching switches connected to each antenna module, thereby returning a signal transmitted from each antenna module as a feedback signal, and performing distortion compensation processing on a transmission signal using the feedback signal for each antenna module.

Patent Literature 3 discloses a technique for distributing a transmission signal after distortion compensation processing to a plurality of antenna modules by performing the distortion compensation processing of adding an opposite distortion signal to the transmission signal by a synthesizer in an RF unit assuming that operations of all antenna modules forming a phased array antenna device have the same characteristics.

Patent Literature 5 discloses a technique for enhancing linearity of each antenna module by extracting a part of signals transmitted from each antenna module as a feedback signal by a distributor connected to each antenna module and performing distortion compensation processing on a transmission signal using the feedback signal for each antenna module.

Patent Literature 6 discloses a technique in which a distortion compensation device is mounted on a part of a plurality of antenna modules forming a phased array antenna device.

CITATION LIST

Patent Literature

Patent Literature 1: JP 2010-232866 A
Patent Literature 2: JP 2006-94043 A
Patent Literature 3: JP 2006-67428 A
Patent Literature 4: JP 2011-19029 A
Patent Literature 5: JP 2002-190712 A
Patent Literature 6: JP 2004-135263 A

SUMMARY OF INVENTION

Technical Problem

Since phased array antenna devices of the related arts are configured in the above manner, in the case of Patent Literature 1, linearity can be enhanced by performing distortion compensation processing on a transmission signal as long as a reception signal can be collected from a receiving terminal as a feedback signal. However, for example, in a case where a receiving terminal is a mobile terminal or the like, a feedback signal may not be collected. Thus, there is a disadvantage that distortion compensation processing may not be performed on a microwave.

In the case of Patent Literatures 2 to 6, linearity of each antenna module can be enhanced. However, there is a disadvantage that, when an amplitude distribution is given in order to suppress side lobes of an antenna pattern, distortion occurs with lower output power than in a case where an amplitude distribution is not given even though linearity of each antenna module is enhanced.

FIGS. 15A and 15B are explanatory diagrams illustrating exemplary antenna patterns of a phased array antenna formed by 4×4 antenna modules.

Particularly, FIG. 15A is a diagram illustrating an antenna pattern and required amplitude distribution when an amplitude distribution is not given. FIG. 15B is a diagram illustrating an antenna pattern and required amplitude distribution when an amplitude distribution is given.

Comparison between FIG. 15A and FIG. 15B shows that side lobes of the antenna pattern can be suppressed more when an amplitude distribution is given.

When power of a signal radiated from each antenna module is changed, gain of a variable gain amplifier or attenuation by a variable attenuator mounted on each antenna module is adjusted. In this case, the same element is usually used for each antenna module forming the phased array antenna and thus saturation power of a final stage amplifier mounted on each antenna module is the same.

Therefore, even when linearity of each antenna module is enhanced, when output power of the entire phased array antenna is raised, a final stage amplifier mounted on an antenna module with required amplitude distribution of 0 dB first operates non-linearly, thus generating distortion regardless of whether an amplitude distribution is given. In the example of FIG. 15A, required amplitude distribution for all of the antenna modules shows 0 dB. In the example of FIG. 15B, required amplitude distribution for four antenna modules arranged in a central part out of the sixteen antenna modules shows 0 dB.

Overall output power of the phased array antenna with an amplitude distribution is lower than overall output power of the phased array antenna without an amplitude distribution due to antenna modules having required amplitude distribution lower than 0 dB in the phased array antenna with an amplitude distribution.

Therefore, when a final stage amplifier mounted on an antenna module with required amplitude distribution of 0 dB operates non-linearly and generates distortion, the overall output power of the phased array antenna with the amplitude distribution is lower than that of the phased array antenna without the amplitude distribution.

FIG. 16 is an explanatory diagram illustrating exemplary output power when an amplitude distribution is given and not given.

The example in FIG. 16 illustrates that deterioration of distortion occurs earlier by approximately 6 dB in the case where the amplitude distribution is given than in the case where the amplitude distribution is not given.

The present invention has been devised in order to solve the disadvantage as described above, and an object of the present invention is to provide a phased array antenna device capable of preventing occurrence of distortion, even when an amplitude distribution is given, up to output power equivalent to that in a case where an amplitude distribution is not given.

Solution to Problem

A phased array antenna device includes: a distortion compensation unit compensating distortion of a signal radiated from a phased array antenna by performing distortion compensation processing on a transmission signal using a distortion compensation coefficient; a distribution unit distributing the transmission signal to which the distortion compensation processing is performed by the distortion compensation unit; a plurality of antenna modules performing signal processing of: performing adjustment of an amplitude and a phase of the transmission signal distributed by the distribution unit; and amplifying power of the transmission signal, and thereby radiating the transmission signal after the signal processing from an element antenna forming the phased array antenna, and performing adjustment of an amplitude and a phase of a feedback signal by using a part of the transmission signal after the signal processing as the feedback signal such that the phases of feedback signals, each of which is the feedback signal of each of the plurality of antenna modules, is synchronized with each other, and outputting the feedback signal which is adjusted by the adjustment of the amplitude and the phase of the feedback signal; a synthesis unit synthesizing feedback signals each of which is output from each of the plurality of antenna modules to generate a synthesized feedback signal. A distortion compensation signal output unit derives, from a difference between the synthesized feedback signal synthesized by the synthesis unit and the transmission signal before the distortion compensation processing by the distortion compensation unit, a distortion compensation coefficient that provides, to the transmission signal, distortion characteristics to be opposite to distortion characteristics of a signal radiated from the phased array antenna and outputs the distortion compensation coefficient to the distortion compensation unit. The plurality of antenna modules is classified into a plurality of groups in accordance with amplitude distribution provided to suppress side lobes of an antenna pattern in the phased array antenna, and a representative antenna module from among one or more antenna modules belonging to a group having a same amplitude distribution among the plurality of groups outputs the feedback signal after the adjustment of the amplitude and the phase to the synthesis unit, and an antenna module other than the representative antenna module does not output the feedback signal to the synthesis unit.

Advantageous Effects of Invention

According to this invention, the synthesis unit for synthesizing feedback signals output from a plurality of antenna modules is provided, and a distortion compensation signal output unit derives, from a difference between a feedback signal synthesized by the synthesis unit and the transmission signal before the distortion compensation processing by the distortion compensation unit, a distortion compensation coefficient that provides, to the transmission signal, distortion characteristics opposite to distortion characteristics of a signal radiated from the phased array antenna and outputs the distortion compensation coefficient to the distortion compensation unit. Therefore, there is an effect of preventing occurrence of distortion, even when an amplitude distribution is given, up to output power equivalent to that in a case where an amplitude distribution is not given.

BRIEF DESCRIPTION OF DRAWINGS

FIGS. 5A to 5D are explanatory diagrams illustrating ACPR characteristics before and after the distortion compensation processing;

FIGS. 9A to 9F are explanatory diagrams illustrating distortion compensation of a radiation signal of the phased array antenna by PD units 13 of modems 1-1 to 1-N;

FIG. 12 is an explanatory diagram illustrating deterioration of distortion compensation amount due to amplitude variance of respective systems with respect to a certain distortion value;

DESCRIPTION OF EMBODIMENTS

To describe the invention further in detail, some embodiments for carrying out the invention will be described below with reference to the accompanying drawings.

First Embodiment

Figure 1:
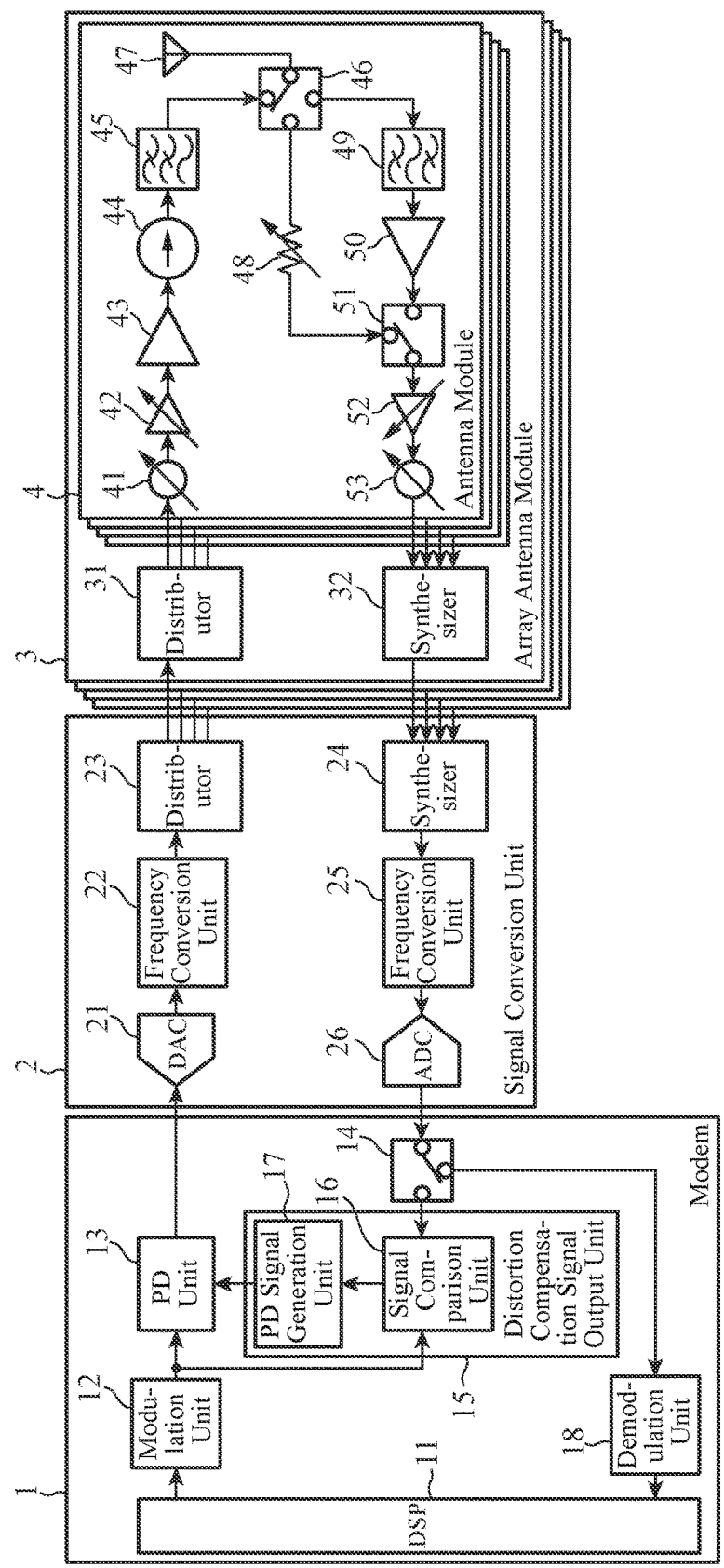
FIG. 1 is a configuration diagram illustrating a phased array antenna device according to a first embodiment of the invention.

FIG. 1 is a configuration diagram illustrating a phased array antenna device according to a first embodiment of the invention.

The phased array antenna device in FIG. 1 is capable of duplex communication that is time division multiplex communication. The phased array antenna device includes a modem 1, a signal conversion unit 2, and four array antenna modules 3 each including four antenna modules 4 that are unit modules.

The example in FIG. 1 illustrates that the number of array antenna modules 3 is four; however, the number of array antenna modules 3 may be any number equal to or larger than one. The example illustrates that the number of antenna modules 4 included in each of the array antenna modules 3 is four; however, the number of antenna modules 4 may be any number equal to or larger than one.

In FIG. 1, a DSP 11 in the modem 1 is a digital signal processor that outputs a digital signal as a transmission signal to a modulation unit 12 and performs predetermined digital signal processing on a reception signal quadrature-demodulated by a demodulation unit 18. As this digital signal processing, for example, general signal processing performed when a communication device receives a signal is assumed.

The modulation unit 12 quadrature-modulates the digital signal output from the DSP 11 and outputs a base band signal that is the digital signal after quadrature-modulation to a predistortion unit (hereinafter referred to as "PD unit") 13 and a distortion compensation signal output unit 15. Here, the example that the modulation unit 12 quadrature-modulates the digital signal output from the DSP 11 and outputs the base band signal that is the digital signal after quadrature-modulation is illustrated; however, this is merely one example. The digital signal may be quadrature-modulated and an intermediate frequency (IF) signal that is the digital signal after quadrature-modulation may be output, for example.

The PD unit 13 is a distortion compensation unit that compensates distortion of a signal radiated from the phased array antenna by performing distortion compensation processing on the base band signal output from the modulation unit 12 using a predistortion signal that is a distortion compensation signal output from the distortion compensation signal output unit 15.

A DA convertor (hereinafter referred to as "DAC") 21 in the signal conversion unit 2 converts the base band signal after distortion compensation processing by the PD 13 in the modem 1 from digital to analog and outputs the analog base band signal.

A frequency conversion unit 22 converts a frequency of the analog base band signal output from the DAC 21 to a wireless frequency and thereby outputs an RF signal that is a signal of the wireless frequency.

A distributor 23 distributes the RF signal output from the frequency conversion unit 22 to the four array antenna modules 3.

A distributor 31 in each of the array antenna modules 3 distributes the RF signal distributed by the distributor 23 in the signal conversion unit 2 to the four antenna modules 4. Here, the distributors 23 and 31 form a distribution unit.

A phase shifter 41 in the antenna module 4 adjusts the phase of the RF signal distributed by the distributor 31 of the array antenna module 3 and outputs the RF signal after the phase adjustment to a variable gain amplifier 42. The phase shift amount of the RF signal added by the phase shifter 41 is determined by an orientation direction of the phased array antenna.

Figure 15:
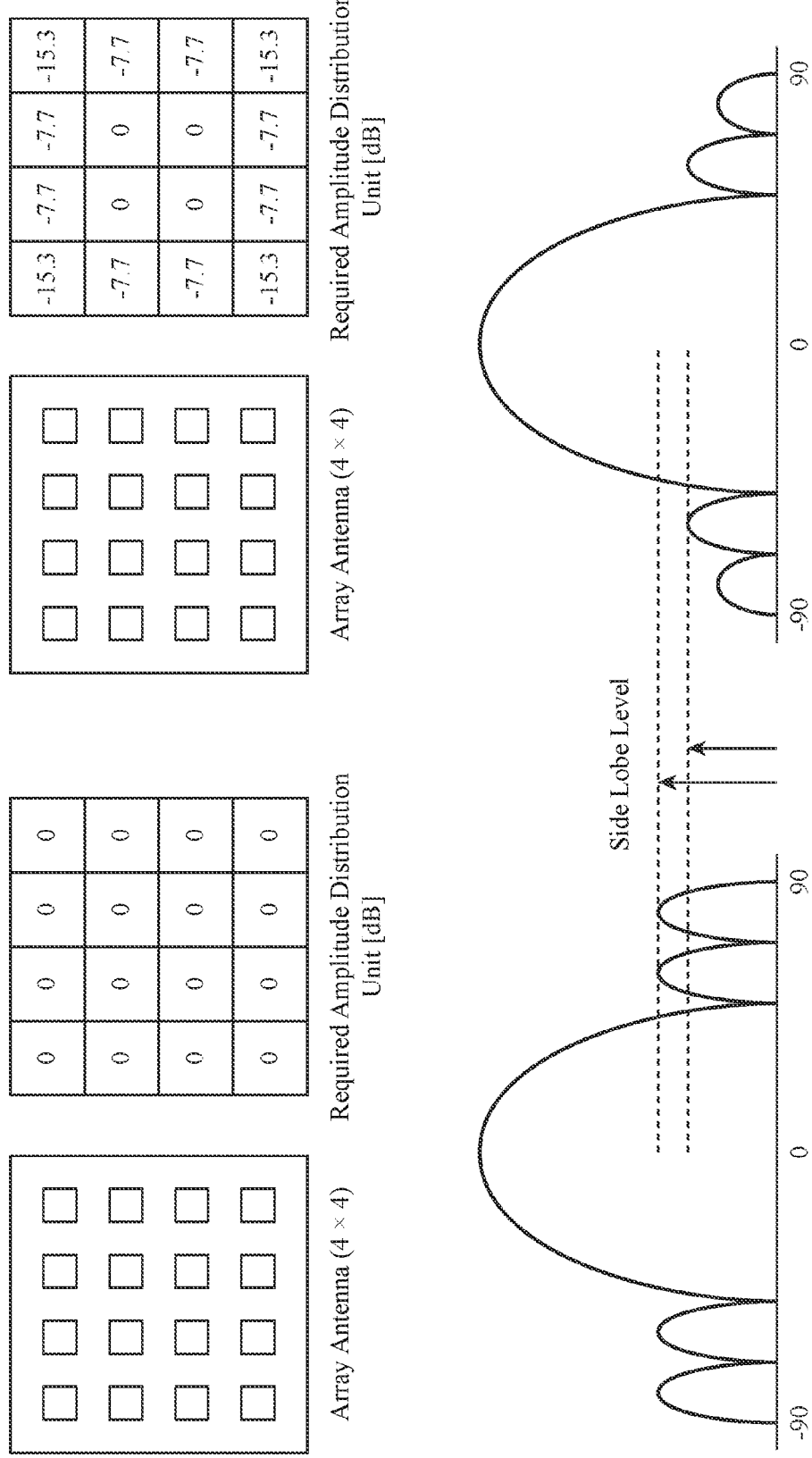
FIGS. 15A and 15B are explanatory diagrams illustrating exemplary antenna patterns of a phased array antenna formed by 4×4 antenna modules.
Figure 16:
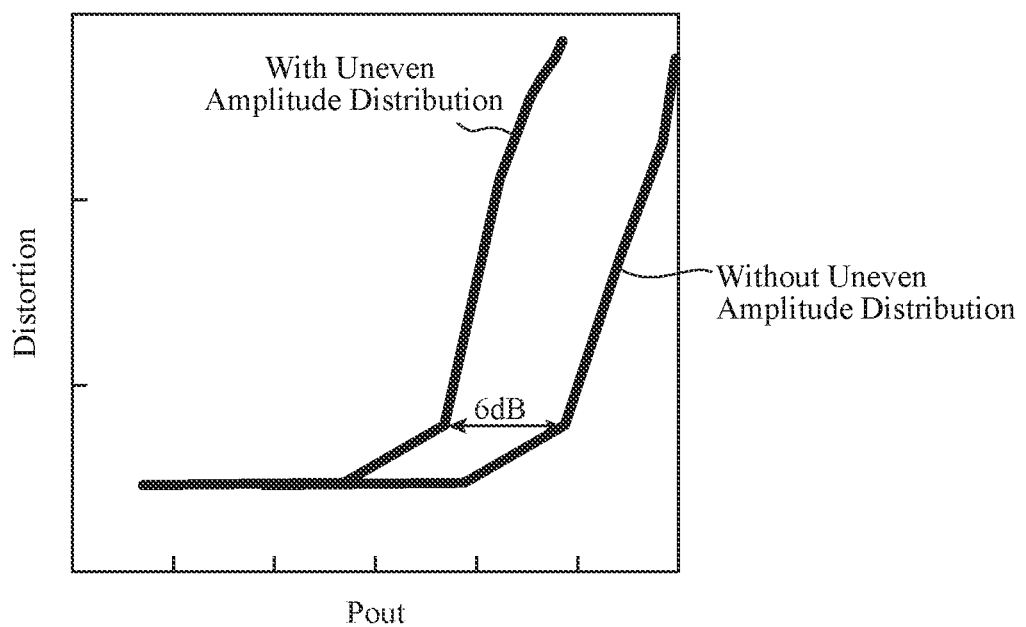
FIG. 16 is an explanatory diagram illustrating exemplary output power when an amplitude distribution is given and not given.

The variable gain amplifier 42 adjusts the amplitude of the RF signal output from the phase shifter 41 and outputs the RF signal after the amplitude adjustment to the power amplifier 43. Each of the antenna modules 4 is given with an amplitude distribution for the purpose of suppressing side lobes of an antenna pattern of the phased array antenna. Gain of the variable gain amplifier 42 is determined by required amplitude distribution of the respective antenna modules 4 as illustrated in FIG. 15B.

Note that, appropriately adjusting the phase and the amplitude of an RF signal by the phase shifter 41 and the variable gain amplifier 42 results in suppressing amplitude and phase errors of each of the antenna modules 4 in a transmission system.

The power amplifier 43 amplifies electric power of the RF signal output from the variable gain amplifier 42.

An isolator 44 isolates output from input in order to reduce influence of active impedance or reflection of an element antenna 47 forming the phased array antenna. When no influence of active impedance is present, the isolator 44 may be omitted.

A filter 45 reduces higher harmonics generated in the power amplifier 43 and outputs an RF signal after reduction of the higher harmonics.

When the RF signal is transmitted, a switch 46 connects the filter 45 and the element antenna 47. As a result of this, the RF signal output from the filter 45 is fed to the element antenna 47 and a part of the RF signal is output to a variable attenuator 48 as a feedback signal.

When an RF signal is received, the switch 46 connects the element antenna 47 and a filter 49.

The element antenna 47 radiates the RF signal output from the switch 46 to the space and receives an arriving RF signal and outputs the RF signal as a reception signal to the switch 46.

The variable attenuator 48 attenuates the amplitude of the feedback signal output from the switch 46 and outputs the feedback signal after the amplitude attenuation.

The filter 49 reduces higher harmonics superimposed on the reception signal output from the switch 46 and outputs the reception signal after the reduction of the higher harmonics.

A low-noise amplifier 50 amplifies electric power of the reception signal output from the filter 49.

When an RF signal is transmitted, a switch 51 connects the variable attenuator 48 and a variable gain amplifier 52. When an RF signal is received, the switch 51 connects the low-noise amplifier 50 and the variable gain amplifier 52.

The variable gain amplifier 52 adjusts the amplitude of the feedback signal or the reception signal output from the switch 51.

A phase shifter 53 adjusts the phase of the feedback signal or the reception signal the amplitude thereof is adjusted by the variable gain amplifier 52.

The phase shift amount of the feedback signal or the reception signal added by the phase shifter 53 is determined such that the phase of the feedback signal or the reception signal is synchronized to be the same phase with the phase of a feedback signal or a reception signal output to a synthesizer 32 from another antenna module 4.

By appropriately adjusting the amplitude and the phase of the feedback signal and the reception signal by the variable gain amplifier 52 and the phase shifter 53, amplitude and phase errors of each of the antenna modules 4 in a reception system are suppressed.

The synthesizer 32 in the array antenna module 3 synthesizes feedback signals or reception signals output from the four antenna modules 4.

A synthesizer 24 in the signal conversion unit 2 synthesizes feedback signals or reception signals synthesized by the synthesizers 32 of the four array antenna modules 3. Here, the synthesizers 32 and the synthesizer 24 form a synthesis unit.

A frequency conversion unit 25 converts the frequency of a feedback signal or a reception signal synthesized by the synthesizer 24 and outputs the feedback signal or the reception signal in a base band.

An AD convertor (hereinafter referred to as "ADC") 26 converts the feedback signal or the reception signal output from the frequency conversion unit 25 from analog to digital and outputs a digital feedback signal or a digital reception signal.

When an RF signal is transmitted, a switch 14 in the modem 1 connects the ADC 26 and the distortion compensation signal output unit 15. When an RF signal is received, the switch 14 connects the ADC 26 and the demodulation unit 18.

The distortion compensation signal output unit 15 derives, from a difference between the base band signal output from the modulation unit 12 and the feedback signal output from the ADC 26 via the switch 14, a distortion compensation coefficient that provides, to the base band signal, distortion characteristics opposite to the distortion characteristics of a signal radiated from the phased array antenna and outputs a predistortion signal representing the distortion compensation coefficient to the PD unit 13.

As methods for deriving the predistortion signal performed by the distortion compensation signal output unit 15, the LUT method, the polynomial method, and the memory polynomial method can be adopted.

The predistortion signal may be derived by any of the methods. In this first embodiment, an example of deriving the predistortion signal by the LUT method will be described.

A signal comparison unit 16 in the distortion compensation signal output unit 15 calculates a difference between the base band signal output from the modulation unit 12 and the feedback signal output from the ADC 26 via the switch 14.

A PD signal generation unit 17 retains in advance a lookup table storing a distortion compensation coefficient corresponding to a difference between a base band signal and a feedback signal. The PD signal generation unit 17 reads out, from the lookup table, a distortion compensation coefficient corresponding to the difference calculated by the signal comparison unit 16 and outputs a predistortion signal representing the distortion compensation coefficient to the PD unit 13.

The demodulation unit 18 quadrature-demodulates the digital reception signal output from the ADC 26 via the switch 14 and outputs the reception signal after quadrature-demodulation to the DSP 11.

Figure 2:
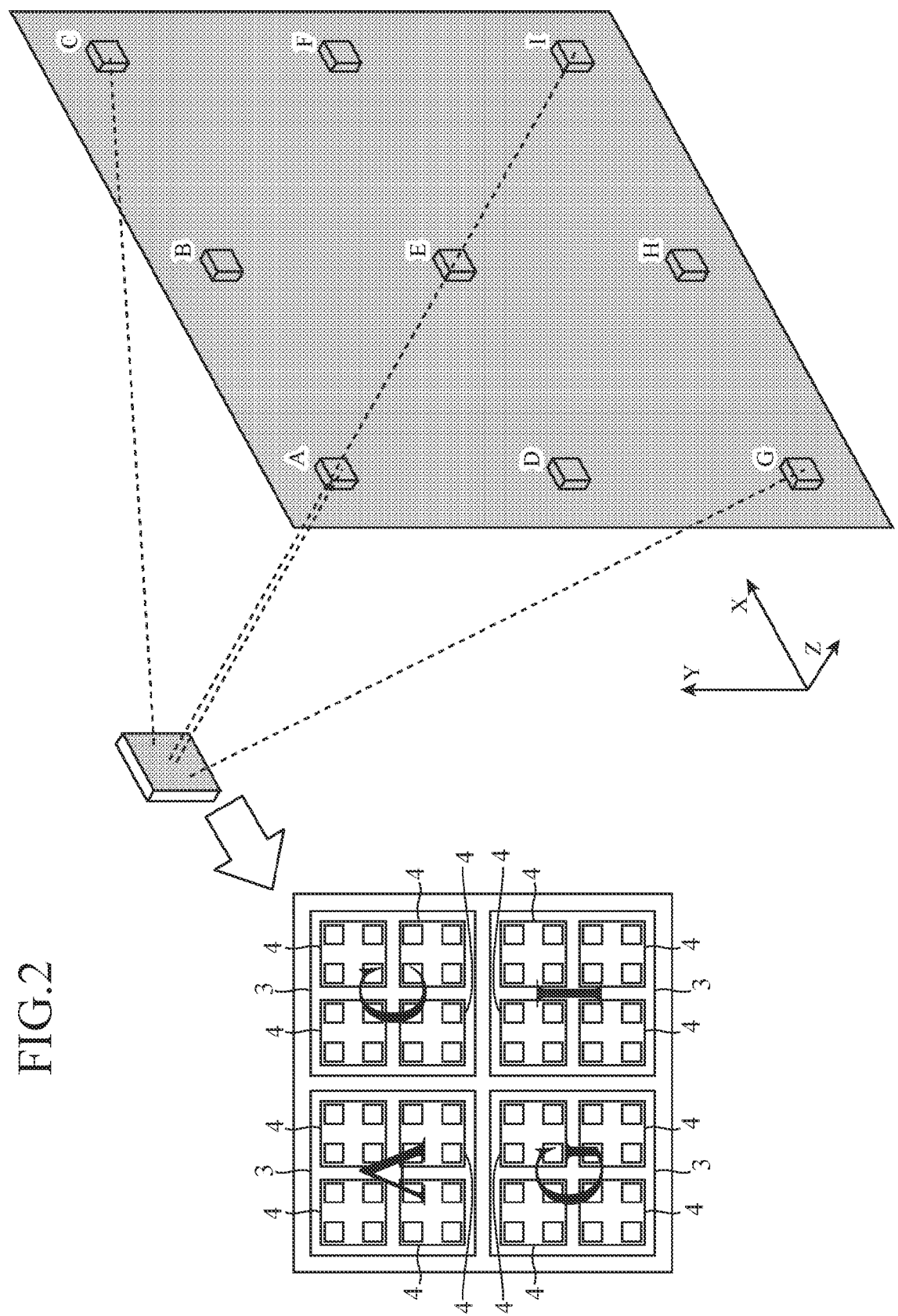
FIG. 2 is an explanatory diagram illustrating a phased array antenna formed by four array antenna modules 3 each including four antenna modules 4.

FIG. 2 is an explanatory diagram illustrating the phased array antenna formed by four array antenna modules 3 each including four antenna modules 4.

In the first embodiment, the four array antenna modules 3 that are subarrays direct beams in directions different from each other (the directions in A, C, G, or I) and thereby perform duplex communication.

Next, operations will be described.

First, operations of transmitting a signal will be described.

The DSP 11 in the modem 1 outputs a digital signal to the modulation unit 12 as a transmission signal.

The modulation unit 12 in the modem 1 quadrature-modulates a digital signal when receiving the digital signal from the DSP 11 and outputs a base band signal that is the digital signal after quadrature-modulation to the PD unit 13 and the distortion compensation signal output unit 15.

The PD unit 13 in the modem 1 performs distortion compensation processing on the base band signal when receiving the base band signal from the modulation unit 12 using a predistortion signal output from the distortion compensation signal output unit 15, which will be described later to compensate distortion of a signal radiated from the phased array antenna.

The distortion compensation processing by the PD unit 13 does not compensate distortion of a signal radiated from each antenna module 4 that is a unit module individually, but integrally compensates distortion of signals radiated from the phased array antenna. That is, by multiplying the base band signal by the predistortion signal that provides distortion characteristics opposite to distortion characteristics of a signal radiated from the phased array antenna, distortion caused by non-linear operation of the power amplifier 43 mounted on an antenna module 4 having required amplitude distribution of 0 dB is compensated.

A DAC 21 in the signal conversion unit 2 converts the base band signal from digital to analog when receiving the base band signal after the distortion compensation processing from the PD unit 13 in the modem 1 and outputs the analog base band signal.

The frequency conversion unit 22 in the signal conversion unit 2 converts a frequency of the base band signal to a wireless frequency when receiving the analog base band signal from the DA convertor 21 and thereby outputs an RF signal that is a signal of the wireless frequency.

The distributor 23 in the signal conversion unit 2 distributes the RF signal to the four array antenna modules 3 when receiving the RF signal from the frequency conversion unit 22.

The distributor 31 in each of the array antenna modules 3 distributes the RF signal to the four antenna modules 4 when receiving the RF signal from the distributor 23 in the signal conversion unit 2.

The phase shifter 41 in each of the antenna modules 4 adjusts the phase of the RF signal when receiving the RF signal from the distributor 31 of the array antenna module 3 and outputs the RF signal after the phase adjustment to the variable gain amplifier 42.

The phase shift amount of the RF signal added by the phase shifter 41 is determined by an orientation direction of the phased array antenna. Some specific examples will be described later.

The variable gain amplifier 42 in each of the antenna modules 4 adjusts the amplitude of the RF signal when receiving the RF signal after the phase adjustment from the phase shifter 41 and outputs the RF signal after the amplitude adjustment to the power amplifier 43. The gain of the variable gain amplifier 42 is determined by required amplitude distribution of each of the array antenna modules 3 as illustrated in FIG. 15B.

The power amplifier 43 in each of the antenna modules 4 amplifies electric power of the RF signal when receiving the RF signal after the amplitude adjustment from the variable gain amplifier 42.

As a result of this, the RF signal power of which is amplified by the power amplifier 43 is output to the isolator 44. When the power amplifier 43 operates non-linearly, distortion occurs in the RF signal output from the power amplifier 43.

The isolator 44 that isolates output from input is provided between the power amplifier 43 and the filter 45 in order to reduce influence of active impedance or reflection of the element antenna 47.

The filter 45 in each of the antenna modules 4 reduces higher harmonics generated in the power amplifier 43 and superimposed on the RF signal when receiving the RF signal having passed the isolator 44 and outputs the RF signal whose higher harmonics are reduced.

The switch 46 of each of the antenna modules 4 connects the filter 45 and the element antenna 47 when an RF signal is transmitted and thus the RF signal output from the filter 45 is fed to the element antenna 47.

As a result of this, the RF signal is radiated from the element antenna 47 to the space while a part of the RF signal output from the filter 45 is fed to the variable attenuator 48 through the switch 46 as a feedback signal.

The variable attenuator 48 in each of the antenna modules 4 attenuates the amplitude of the feedback signal when receiving the feedback signal from the switch 46 and outputs the feedback signal after the amplitude attenuation.

The switch 51 of each of the antenna modules 4 connects the variable attenuator 48 and the variable gain amplifier 52 when an RF signal is transmitted and thus the feedback signal output from the variable attenuator 48 is fed to the variable gain amplifier 52.

The variable gain amplifier 52 in each of the antenna modules 4 adjusts the amplitude of the feedback signal when receiving the feedback signal from the switch 51.

The phase shifter 53 in each of the antenna modules 4 adjusts the phase of the feedback signal when receiving the feedback signal after the amplitude adjustment from the variable gain amplifier 52.

The phase shift amount of the feedback signal added by the phase shifter 53 is determined such that the phase of the feedback signal is synchronized with the phases of feedback signals output from the other antenna modules 4 to the synthesizer 32.

By determining the phase shift amount of the feedback signal added by the phase shifter 53 in a similar manner in each of the antenna modules 4 in the four array antenna modules 3, the phases of synthesized feedback signals output from the synthesizers 32 of the four array antenna modules 3 are synchronized to be the same phase.

A specific example of a phase shift amount of a feedback signal added by the phase shifters 41 and 53 in each of the antenna modules 4 will be explicitly described.

Figure 3:
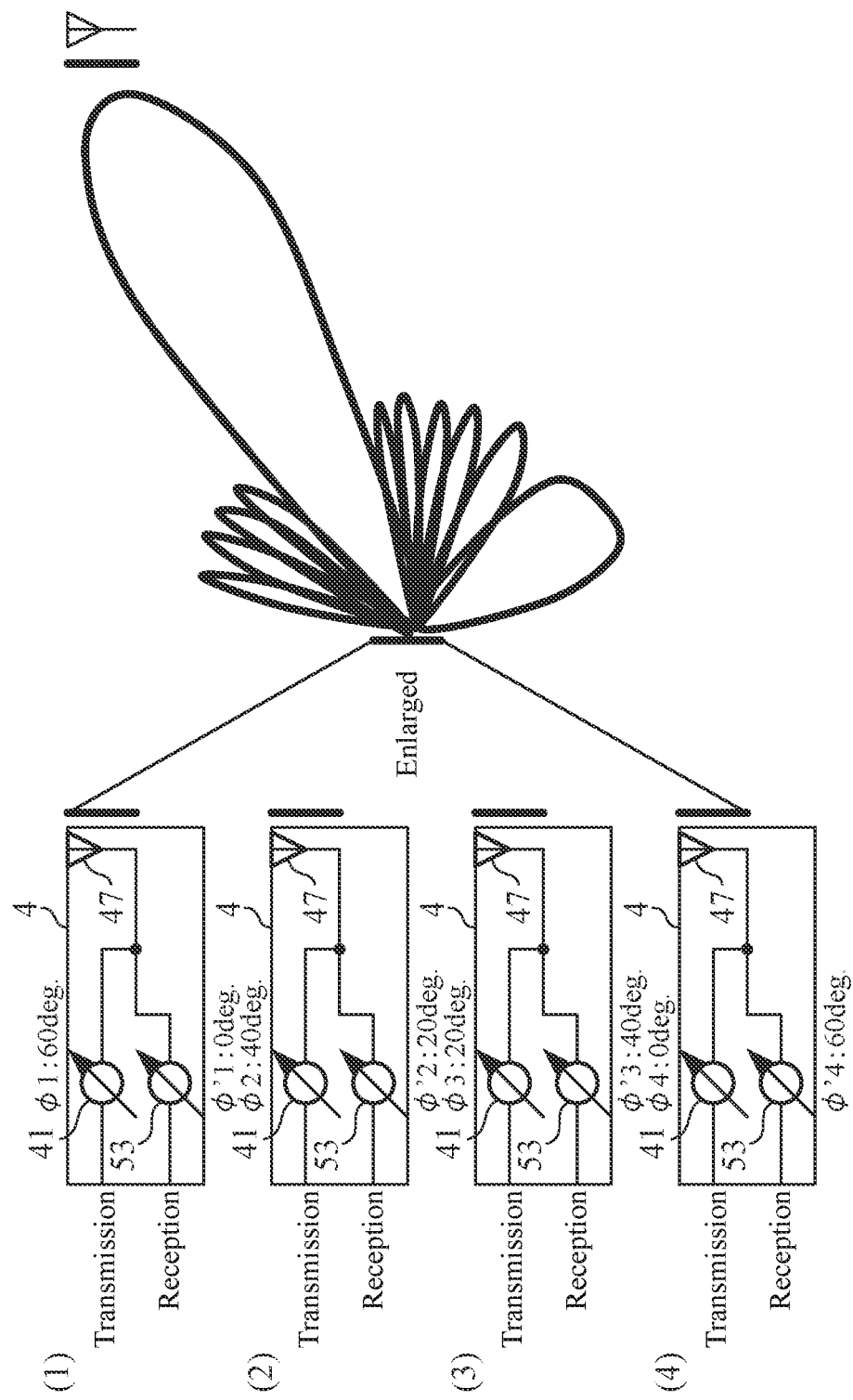
FIG. 3 is an explanatory diagram illustrating phase shifters 41 and 53 of the four antenna modules 4 included in each of the array antenna modules 3.

FIG. 3 is an explanatory diagram illustrating the phase shifters 41 and 53 of the four antenna modules 4 included in each of the array antenna modules 3. Note that illustration of elements other than the phase shifters 41 and 53 and the element antennas 47 are omitted in FIG. 3 for simplifying explanation. In FIG. 3, the four antenna modules 4 are distinguished by symbols (1) to (4).

In the example shown in FIG. 3, phase shift amounts $\phi 1$ to $\phi 4$ of the phase shifters 41 in the antenna modules 4 indicated by (1) to (4) are set as the followings.

$\phi 1 = 60$ deg
$\phi 2 = 40$ deg
$\phi 3 = 20$ deg
$\phi 4 = 0$ deg

The phase shift amounts $\phi 1$ to $\phi 4$ of the phase shifters 53 in the antenna modules 4 indicated by (1) to (4) are further set as the followings in order to synchronize phases of the feedback signals output from the antenna modules 4 indicated by (1) to (4) to the synthesizer 32.

$\phi' 1 = 0$ deg
$\phi' 2 = 20$ deg
$\phi' 3 = 40$ deg
$\phi' 4 = 60$ deg

The synthesizer 32 in each of the array antenna modules 3 synthesizes four feedback signals when receiving the feedback signals from the four antenna modules 4 and outputs the synthesized feedback signal.

The synthesizer 24 in the signal conversion unit 2 further synthesizes four feedback signals when receiving the synthesized feedback signals from the synthesizers 32 in the four array antenna modules 3 and outputs the synthesized feedback signal.

As a result of this, the feedback signals output from the sixteen (=4×4) antenna modules 4 are synthesized and the synthesized feedback signal is output to the frequency conversion unit 25.

The frequency conversion unit 25 in the signal conversion unit 2 converts the frequency of the feedback signal when receiving the synthesized feedback signal from the synthesizer 24 and outputs the feedback signal in the base band.

The ADC 26 in the signal conversion unit 2 converts the feedback signal from analog to digital when receiving the feedback signal in the base band from the frequency conversion unit 25 and outputs the digital feedback signal.

The switch 14 in the modem 1 connects the ADC 26 and the distortion compensation signal output unit 15 when an RF signal is transmitted and thus the digital feedback signal output from the ADC 26 is fed to the distortion compensation signal output unit 15.

When receiving the digital feedback signal from the switch 14, the distortion compensation signal output unit 15 in the modem 1 derives, from a difference between the feedback signal and the base band signal output from the modulation unit 12, a distortion compensation coefficient that provides, to the base band signal, distortion characteristics opposite to the distortion characteristics of a signal radiated from the phased array antenna and outputs a pre-distortion signal representing the distortion compensation coefficient to the PD unit 13.

That is, the signal comparison unit 16 in the distortion compensation signal output unit 15 calculates a difference between the base band signal output from the modulation unit 12 and the feedback signal output from the ADC 26 via the switch 14. This difference corresponds to a distortion component of a signal radiated from the phased array antenna.

The PD signal generation unit 17 in the distortion compensation signal output unit 15 retains in advance a lookup table storing a distortion compensation coefficient corresponding to a difference between a base band signal and a feedback signal. The PD signal generation unit 17 reads out, from the lookup table, a distortion compensation coefficient corresponding to the difference calculated by the signal comparison unit 16 and outputs the predistortion signal representing the distortion compensation coefficient to the PD unit 13.

The example in which the distortion compensation signal output unit 15 derives a predistortion signal by the LUT method is illustrated here; however, a predistortion signal may be derived by another method such as the polynomial method or the memory polynomial method.

Note that, in a case where there is no sufficient time for calculating the distortion compensation coefficient for predistortion when a beam is swung by the phased array antenna (when time for controlling the beam is shorter than convergence time), a distortion compensation coefficient corresponding to a difference between a base band signal and a feedback signal may be prestored in a lookup table for each angle of swinging of the beam. A distortion compensation coefficient corresponding to a difference between a base band signal and a feedback signal may be read out from the lookup table corresponding to the angle of the beam every time the beam is swung. In this case, a difference between the base band signal output from the modulation unit 12 and the feedback signal output from the ADC 26 via the switch 14 is calculated and a distortion compensation coefficient corresponding to the difference is calculated. When an enough amount of difference values is collected for updating the lookup table, the lookup table is updated by storing distortion compensation coefficients corresponding to those differences in the lookup table. At a next timing, a distortion compensation coefficient is read out from the updated lookup table and a predistortion signal representing the distortion compensation coefficient is output to the PD unit 13.

When receiving the predistortion signal from the distortion compensation signal output unit 15, the PD unit 13 in the modem 1 multiplies the base band signal output from the modulation unit 12 by the predistortion signal as described above, thereby compensating distortion of a radiation signal of the phased array antenna caused by non-linear operation of the power amplifier 43 mounted on the antenna module 4.

Next, operations of receiving a signal will be described.

The switch 46 in each of the antenna modules 4 connects the element antenna 47 and the filter 49 when an RF signal is received and thus a reception signal of the element antenna 47 is fed to the filter 49.

The filter 49 in each of the antenna modules 4 reduces higher harmonics superimposed on the reception signal when receiving the reception signal from the switch 46 and outputs the reception signal after reduction of the higher harmonics.

The low-noise amplifier 50 in each of the antenna modules 4 amplifies power of the reception signal when receiving the reception signal after reduction of the higher harmonics from the filter 49 and outputs the reception signal after power amplification.

The switch 51 of each of the antenna modules 4 connects the low-noise amplifier 50 and the variable gain amplifier 52 when an RF signal is received and thus the reception signal after power amplification output from the low-noise amplifier 50 is fed to the variable gain amplifier 52.

The variable gain amplifier 52 in each of the antenna modules 4 adjusts the amplitude of the reception signal when receiving the reception signal from the switch 51.

The phase shifter 53 in each of the antenna modules 4 adjusts the phase of the reception signal when receiving the reception signal after the amplitude adjustment from the variable gain amplifier 52.

The phase shift amount of the reception signal added by the phase shifter 53 is determined such that the phase of the reception signal is synchronized with the phases of reception signals output to the synthesizer 32 from the other antenna modules 4.

The phase shift amount of the reception signal added by the phase shifter 53 is similar to the phase shift amount of the feedback signal and thus descriptions on a specific example thereof will be omitted.

The synthesizer 32 in each of the array antenna modules 3 synthesizes four reception signals when receiving the reception signals from the four antenna modules 4 and outputs the synthesized reception signal.

The synthesizer 24 in the signal conversion unit 2 further synthesizes four synthesized reception signals when receiving the synthesized reception signals from the synthesizers 32 in the four array antenna modules 3 and outputs the synthesized reception signal.

As a result of this, the reception signals output from the sixteen (=4×4) antenna modules 4 are synthesized and the synthesized reception signal is output to the frequency conversion unit 25.

The frequency conversion unit 25 in the signal conversion unit 2 converts the frequency of the reception signal when receiving the synthesized reception signal from the synthesizer 24 and outputs the reception signal in the base band.

The ADC 26 in the signal conversion unit 2 converts the reception signal from analog to digital when receiving the reception signal in the base band from the frequency conversion unit 25 and outputs the digital reception signal.

The switch 14 in the modem 1 connects the ADC 26 and the demodulation unit 18 when an RF signal is received and thus the digital reception signal output from the ADC 26 is fed to the demodulation unit 18.

The demodulation unit 18 in the modem 1 quadrature-demodulates the reception signal when receiving the digital reception signal from the switch 14 and outputs the reception signal after quadrature-demodulation to the DSP 11.

The DSP 11 in the modem 1 performs predetermined digital signal processing on the reception signal when receiving the reception signal after quadrature-demodulation from the demodulation unit 18.

According to the first embodiment, even when an amplitude distribution is given in order to suppress side lobes of an antenna pattern, occurrence of distortion can be prevented up to output power equivalent to that in a case where an amplitude distribution is not given. A result of distortion compensation when an amplitude distribution is given as well as a result of distortion compensation when an amplitude distribution is not given will be described below.

Figure 4:
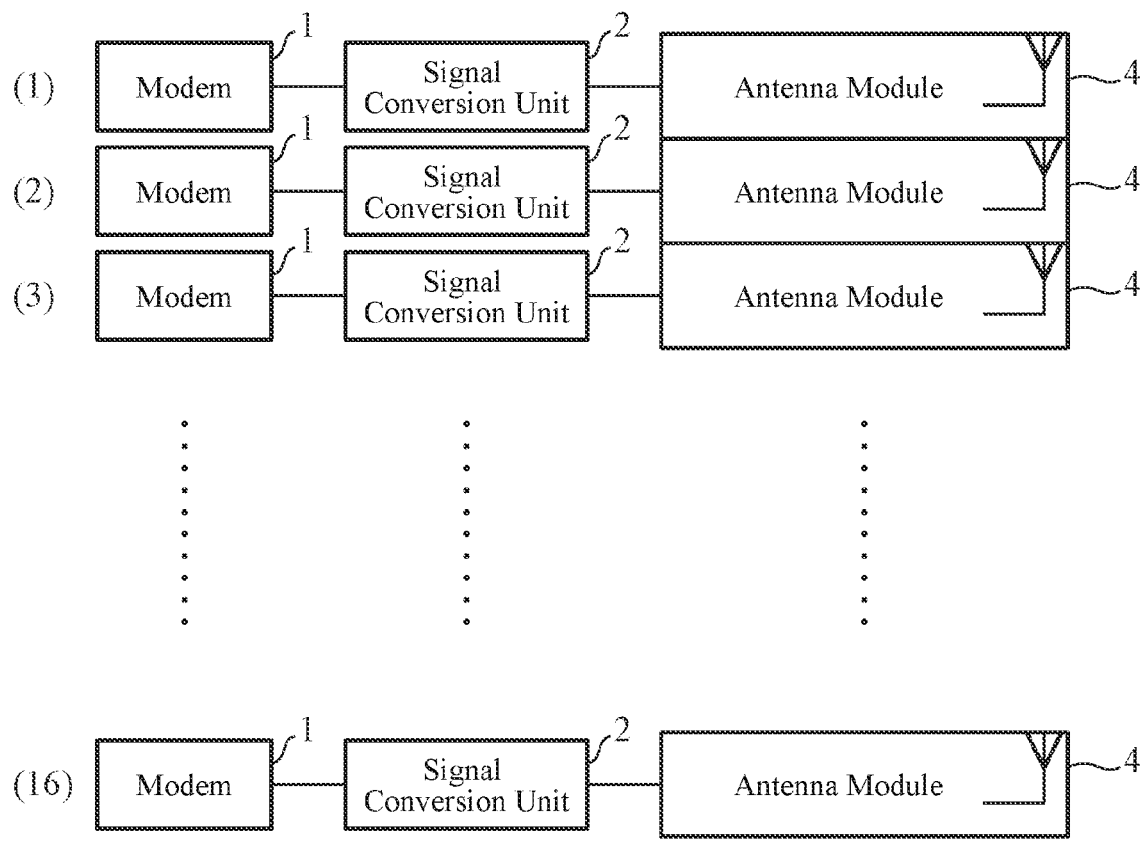
FIG. 4 is a configuration diagram illustrating a general phased array antenna device that performs distortion compensation processing on each antenna module 4.

FIG. 4 is a configuration diagram illustrating a general phased array antenna device that performs distortion compensation processing on each antenna module 4.

FIG. 5 is an explanatory diagram illustrating ACPR characteristics before and after the distortion compensation processing. The ACPR stands for an adjacent-channel leakage power ratio. As the ACPR is higher, distortion is more serious.

Specifically, FIG. 5A is a diagram illustrating ACPR characteristics before and after distortion compensation processing when a required amplitude distribution is not given as illustrated in FIG. 15A in the configuration in FIG. 4. FIG. 5B is a diagram illustrating ACPR characteristics before and after distortion compensation processing when a required amplitude distribution is not given as illustrated in FIG. 15A in the configuration in FIG. 1 of the first embodiment.

FIG. 5C is a diagram illustrating ACPR characteristics before and after distortion compensation processing when a required amplitude distribution is given as illustrated in FIG. 15B in the configuration in FIG. 4. FIG. 5D is a diagram illustrating ACPR characteristics before and after distortion compensation processing when a required amplitude distribution is given as illustrated in FIG. 15B in the configuration in FIG. 1 of the first embodiment.

When a required amplitude distribution is not given, ACPR characteristics after distortion compensation processing do not vary significantly as illustrated in FIGS. 5A and 5B, between the configuration in FIG. 4 and the configuration in FIG. 1 in the first embodiment.

However, when a required amplitude distribution is given, as illustrated in FIGS. 5C and 5D, it is clear that ACPR characteristics after distortion compensation processing are significantly improved in the configuration in FIG. 1 of the first embodiment than in the configuration in FIG. 4.

Specifically, when ACPR=−50 dBc is assumed as a reference, improvement of back-off power is limited to approximately 4.1 dB in the configuration in FIG. 4. However, in the configuration in FIG. 1 of the first embodiment, improvement of back-off power is approximately 9.6 dB.

In the configuration in FIG. 1 of the first embodiment, improvement in the back-off power is significant and thus the minimum output power where distortion occurs becomes larger than in the configuration in FIG. 4.

Figure 6B:
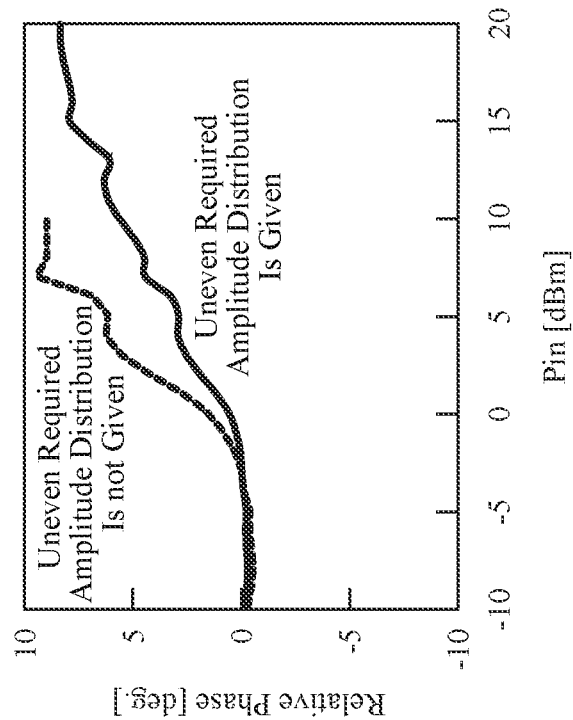
FIGS. 6A and 6B are explanatory diagrams illustrating amplitude and phase characteristics of a synthesized signal of feedback signals output from the sixteen (=4×4) antenna modules 4.
Figure 6A:
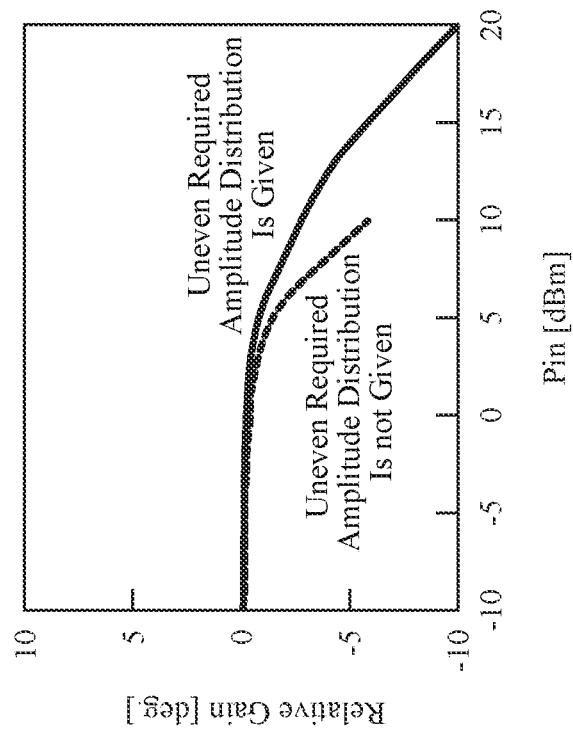

FIGS. 6A and 6B are explanatory diagrams illustrating amplitude and phase characteristics of a synthesized signal of feedback signals output from the sixteen (=4×4) antenna modules 4.

FIG. 6A is a diagram illustrating amplitude characteristics of the synthesized signal. FIG. 6B is a diagram illustrating phase characteristics of the synthesized signal.

It is understood from FIGS. 6A and 6B that amplitude and phase characteristics of the synthesized signal of the feedback signals vary depending on whether the required amplitude distribution is given or not.

Since amplitude and phase characteristics of a synthesized signal of feedback signals change in such a manner, it is understood that there is a need to perform distortion compensation processing not for each of the antenna modules 4 as a unit module but for the entire phased array antenna.

As can be understood clearly from the above, according to the first embodiment, the synthesizers 32 and 24 for synthesizing feedback signals output from the plurality of antenna modules 4 are provided and a distortion compensation signal output unit 15 derives, from a difference between a feedback signal synthesized by the synthesizers 32 and 24 and the base band signal output from the modulation unit 12, a distortion compensation coefficient that provides, to the base band signal, distortion characteristics opposite to distortion characteristics of a signal radiated from the phased array antenna and outputs a predistortion signal representing the distortion compensation coefficient to the PD unit 13. This achieves an effect of preventing occurrence of distortion, even when an amplitude distribution is given in order for the variable gain amplifier 42 in each of the antenna modules 4 to suppress side lobes of an antenna pattern, up to output power equivalent to that in a case where an amplitude distribution is not given.

In the first embodiment, a device mounting four array antenna modules 3 each including four antenna modules 4 is illustrated; however, sixteen antenna modules 4 may be mounted without mounting the array antenna modules 3.

In this case, it is only required that the distributor 23 in the signal conversion unit 2 distributes an RF signal output from the frequency conversion unit 22 to the sixteen antenna modules 4 and that the synthesizer 24 in the signal conversion unit 2 synthesizes feedback signals output from the sixteen antenna modules 4.

Note that, in the first embodiment, an amplifier is not mounted on the signal conversion unit 2 for simplifying descriptions. However, needless to say, an amplifier may be mounted on the signal conversion unit 2.

Furthermore, descriptions on a calibration function for synchronizing the amplitude and the phase for transmission and reception, controlling of variable units, or other functions which are necessary for a phased array antenna are omitted in the first embodiment; however, a calibration function and other functions are provided as general techniques.

Second Embodiment

In the first embodiment described above, one modem 1 and one signal conversion unit 2 are mounted; however, the number of each of the mounted modems 1 and the mounted signal conversion units 2 may be the same as that of element antennas 47 forming the phased array antenna.

Figure 7:
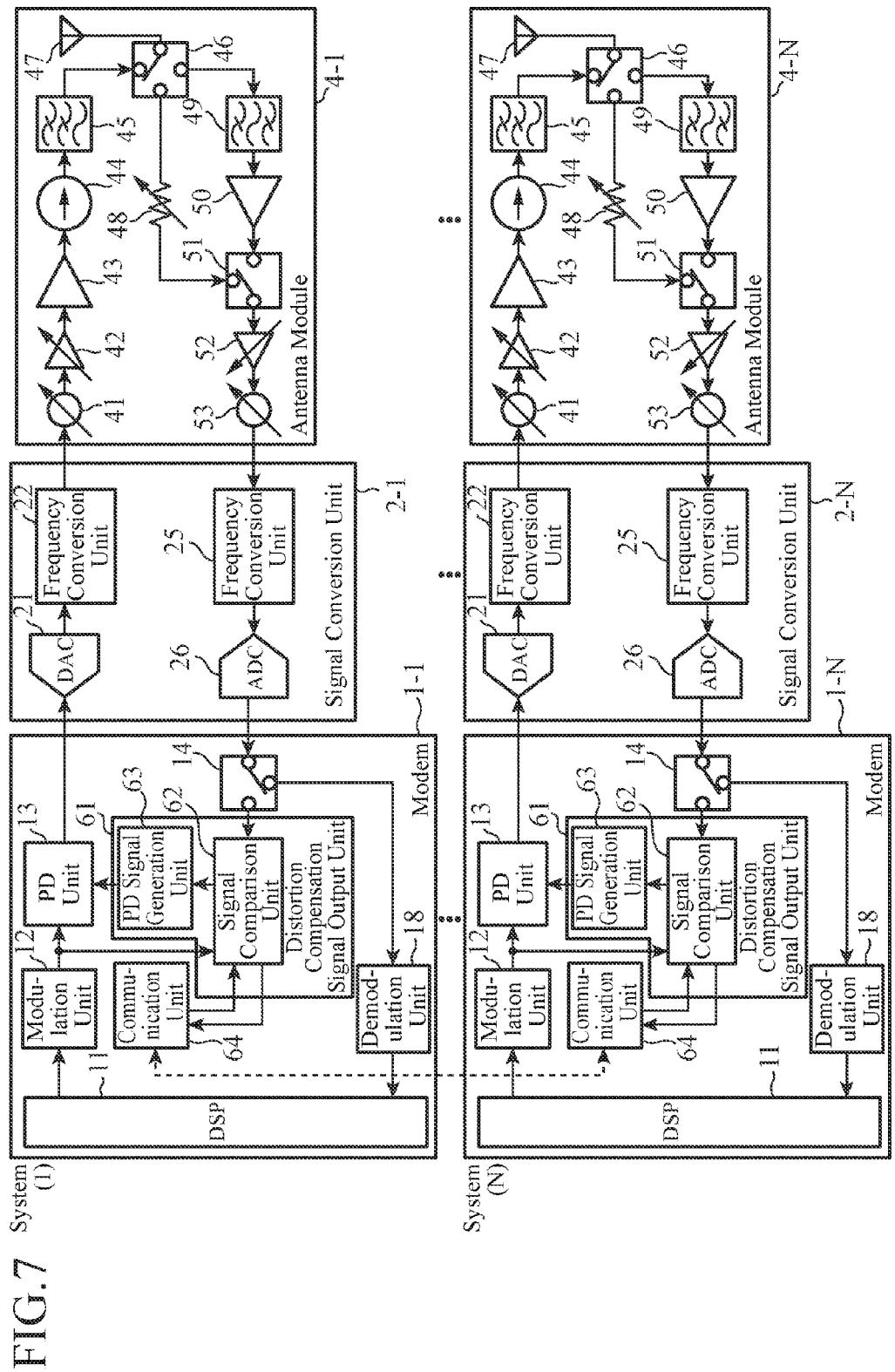
FIG. 7 is a configuration diagram illustrating a phased array antenna device according to a second embodiment of the invention.

FIG. 7 is a configuration diagram illustrating a phased array antenna device according to a second embodiment of the invention. In FIG. 7, the same symbols as those in FIG. 1 represent the same or corresponding parts and thus descriptions thereof are omitted.

Each of modems 1-$n$ ($n$=1, 2, . . . , N) is provided to each element antenna 47 forming a phased array antenna. Transmission signals output to modulation units 12 from DSPs 11 in the modems 1-1 to 1-N are the same digital signals.

In this second embodiment, descriptions are given assuming that N=16 for convenience of explanation; however, N may be any number of 2 or more.

A distortion compensation signal output unit 61 in the modem 1-$n$ synthesizes feedback signals output from ADCs 26 in signal conversion units 2-1 to 2-N and derives, from a difference between the synthesized feedback signal and the base band signal output from the modulation unit 12, a distortion compensation coefficient that provides, to the base band signal, distortion characteristics opposite to distortion characteristics of a signal radiated from the phased array antenna and outputs a predistortion signal representing the distortion compensation coefficient to a PD unit 13.

As methods for deriving the predistortion signal by the distortion compensation signal output unit 61, the LUT method, the polynomial method, and the memory polynomial method can be adopted.

The predistortion signal may be derived by any of the methods. In the second embodiment, an example of deriving the predistortion signal by the LUT method will be described.

A signal comparison unit 62 in the distortion compensation signal output unit 61 in the modem 1-$n$ synthesizes a feedback signal output from the ADC 26 in the signal conversion unit 2-$n$ in the same system ($n$) via a switch 14 and feedback signals output from ADCs 26 in the other systems.

For example, the signal comparison unit 62 in the modem 1-1 synthesizes a feedback signal output from the ADC 26 in the signal conversion unit 2-1 and N-1 feedback signals output from the ADCs 26 in the signal conversion units 2-2 to 2-N and acquired by a communication unit 64 in the modem 1-1.

The signal comparison unit 62 in the distortion compensation signal output unit 61 in the modem 1-$n$ calculates a difference between the synthesized feedback signal and a base band signal output from the modulation unit 12.

A PD signal generation unit 63 in the distortion compensation signal output unit 61 in the modem 1-n retains in advance a lookup table storing a distortion compensation coefficient corresponding to a difference between a base band signal and a synthesized feedback signal. The PD signal generation unit 63 reads out, from the lookup table, a distortion compensation coefficient corresponding to the difference calculated by the signal comparison unit 62 and outputs a predistortion signal representing the distortion compensation coefficient to the PD unit 13 in the modem 1-n.

The communication unit 64 in the modem 1-n transmits a feedback signal output from the ADC 26 in the signal conversion unit 2-n in the same system (n) to communication units 64 in the other systems and receives N-1 feedback signals transmitted from communication units 64 in the other systems and outputs the N-1 feedback signals to the signal comparison unit 62 in the modem 1-n.

For example, the communication unit 64 in the modem 1-1 transmits a feedback signal output from the ADC 26 in the signal conversion unit 2-1 to communication units 64 in the modems 1-2 to 1-N and receives N-1 feedback signals transmitted from the communication units 64 in the modems 1-2 to 1-N and outputs the N-1 feedback signals to the signal comparison unit 62 in the modem 1-1.

The signal conversion unit 2-n (n=1, 2, . . . , N) is provided to each of the element antennas 47 forming a phased array antenna but does not include the distributor 23 or the synthesizer 24 unlike the signal conversion unit 2 in FIG. 1.

An Antenna module 4-n (n=1, 2, . . . , N) has the same configuration as that of the antenna module 4 in FIG. 1 and is provided for each element antenna 47 forming the phased array antenna.

Figure 8:
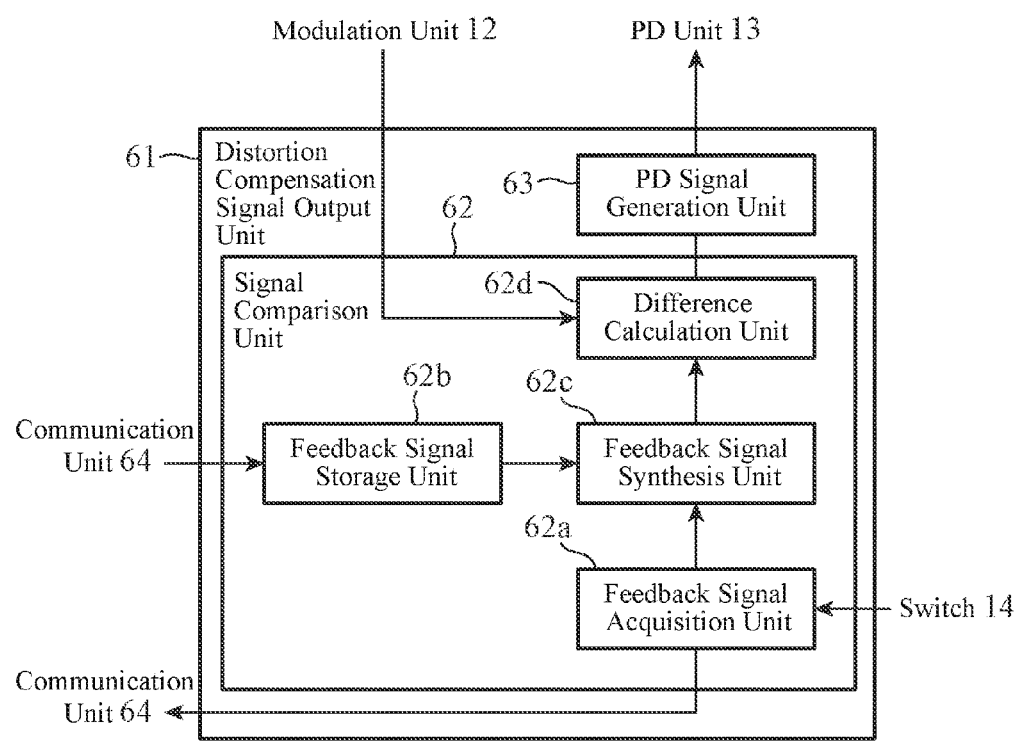
FIG. 8 is a configuration diagram illustrating a distortion compensation signal output unit 61 in a modem 1-$n$ of the phased array antenna device according to the second embodiment of the invention.

FIG. 8 is a configuration diagram illustrating the distortion compensation signal output unit 61 in the modem 1-n of the phased array antenna device according to the second embodiment of the invention.

In FIG. 8, a feedback signal acquisition unit 62a acquires a feedback signal output from the ADC 26 in the signal conversion unit 2-n in the same system (n) via the switch 14, outputs the feedback signal to a feedback signal synthesis unit 62c, and outputs the feedback signal to the communication unit 64, thereby outputting the feedback signal to the distortion compensation signal output units 61 in the other systems.

A feedback signal storage unit 62b stores feedback signals of the other systems received by the communication unit 64.

The feedback signal synthesis unit 62c synthesizes the feedback signal output from the feedback signal acquisition unit 62a and the feedback signals of the other systems stored in the feedback signal storage unit 62b.

A difference calculation unit 62d calculates a difference between the feedback signal synthesized by the feedback signal synthesis unit 62c and a base band signal output from the modulation unit 12.

Next, operations will be described.

First, operations of transmitting a signal will be described.

The DSP 11 in the modem 1-n (n=1, 2, . . . , N) outputs a digital signal as a transmission signal to the modulation unit 12.

The modulation unit 12 in the modem 1-n quadrature-modulates the digital signal when receiving the digital signal from the DSP 11 and outputs a base band signal that is the digital signal after quadrature-modulation to the PD unit 13 and the distortion compensation signal output unit 61.

The PD unit 13 in the modem 1-n performs distortion compensation processing on the base band signal, when receiving the base band signal from the modulation unit 12, using a predistortion signal output from the distortion compensation signal output unit 61, which will be described later, and compensates distortion of a signal radiated from the phased array antenna.

The distortion compensation processing by the PD unit 13 does not separately compensate distortion of a signal radiated from the antenna module 4 that is a unit module, but, similarly to the first embodiment, integrally compensates distortion of a signal radiated from the phased array antenna.

A DAC 21 in the signal conversion unit 2-n converts the base band signal from digital to analog when receiving the base band signal after the distortion compensation processing from the PD unit 13 in the modem 1-n and outputs the analog base band signal.

A frequency conversion unit 22 in the signal conversion unit 2-n converts a frequency of the base band signal to a wireless frequency when receiving the analog base band signal from the DA convertor 21 and thereby outputs an RF signal that is a signal of the wireless frequency.

A phase shifter 41 in the antenna module 4-n adjusts the phase of the RF signal when receiving the RF signal from the frequency conversion unit 22 in the signal conversion unit 2-n, similarly to the first embodiment, and outputs the RF signal after the phase adjustment to a variable gain amplifier 42.

The variable gain amplifier 42 in the antenna module 4-n adjusts the amplitude of the RF signal when receiving the RF signal after the phase adjustment from the phase shifter 41, similarly to the first embodiment, and outputs the RF signal after the amplitude adjustment to a power amplifier 43.

The power amplifier 43 in the antenna modules 4-n amplifies power of the RF signal when receiving the RF signal after the amplitude adjustment from the variable gain amplifier 42, similarly to the first embodiment.

As a result of this, the RF signal power of which is amplified by the power amplifier 43 is output to an isolator 44, and when the power amplifier 43 operates non-linearly, distortion occurs in the RF signal output from the power amplifier 43.

The isolator 44 that isolates output from input is provided between the power amplifier 43 and a filter 45 in order to reduce influence of active impedance or reflection of the element antenna 47.

The filter 45 in the antenna module 4-n reduces higher harmonics generated in the power amplifier 43 and superimposed on the RF signal, similarly to the first embodiment, when receiving the RF signal having passed the isolator 44 and outputs the RF signal whose higher harmonics are reduced.

A switch 46 of the antenna module 4-n connects the filter 45 and the element antenna 47 when an RF signal is transmitted and thus the RF signal output from the filter 45 is fed to the element antenna 47.

As a result of this, the RF signal is radiated to the space from the element antenna 47 while a part of the RF signal output from the filter 45 is fed to a variable attenuator 48 through the switch 46 as a feedback signal.

The variable attenuator 48 in the antenna module 4-n attenuates the amplitude of the feedback signal when receiving the feedback signal from the switch 46, similarly to the first embodiment, and outputs the feedback signal after the amplitude attenuation.

A switch 51 of the antenna module 4-n connects the variable attenuator 48 and a variable gain amplifier 52 when an RF signal is transmitted and thus the feedback signal output from the variable attenuator 48 is fed to the variable gain amplifier 52.

The variable gain amplifier 52 in the antenna module **4-*n* adjusts the amplitude of the feedback signal when receiving the feedback signal from the switch 51** similarly to the first embodiment.

A phase shifter 53 in the antenna module **4-*n* adjusts the phase of the feedback signal when receiving the feedback signal after the amplitude adjustment from the variable gain amplifier 52** similarly to the first embodiment.

The phase shift amount of the feedback signal added by the phase shifter 53 in the antenna module **4-*n* is determined such that the phase of the feedback signal is synchronized with the phases of feedback signals output from the other antenna modules 4**.

A frequency conversion unit 25 in the signal conversion unit **2-*n* converts the frequency of the feedback signal when receiving the feedback signal after the phase adjustment from the antenna module 4-*n*** and outputs the feedback signal in a base band.

The ADC 26 in the signal conversion unit **2-*n* converts the feedback signal from analog to digital when receiving the feedback signal in the base band from the frequency conversion unit 25** and outputs the digital feedback signal.

The switch 14 in the modem **1-*n* connects the ADC 26 and the distortion compensation signal output unit 61 when an RF signal is transmitted and thus the digital feedback signal output from the ADC 26 is fed to the distortion compensation signal output unit 61**.

The distortion compensation signal output unit 61 in the modem **1-*n* synthesizes feedback signals output from the ADCs 26 in the signal conversion units 2-1 to 2-N and derives, from a difference between the synthesized feedback signal and the base band signal output from the modulation unit 12, a distortion compensation coefficient that provides, to the base band signal, distortion characteristics opposite to distortion characteristics of a signal radiated from the phased array antenna and outputs a predistortion signal representing the distortion compensation coefficient to the PD unit 13 in the modem 1-*n***.

That is, when receiving the feedback signal from the ADC 26 in the signal conversion unit **2-*n* in the same system (n) via the switch 14, the feedback signal acquisition unit 62*a* in the distortion compensation signal output unit 61 in the modem 1-*n* outputs the feedback signal to the feedback signal synthesis unit 62*c* while outputting the feedback signal to the communication unit 64**.

The communication unit 64 in the modem **1-*n* transmits the feedback signal to the communication units 64 in the other systems when receiving the feedback signal from the feedback signal acquisition unit 62*a***.

The communication unit 64 in the modem **1-*n* receives N-1 feedback signals transmitted from the communication units 64 in the other systems and stores the N-1 feedback signals in the feedback signal storage unit 62*b***.

The feedback signal synthesis unit **62*c* in the distortion compensation signal output unit 61 in the modem 1-*n* reads out the N-1 feedback signals of the other systems from the feedback signal storage unit 62*b* and synthesizes the N-1 feedback signals and the feedback signal which is output from the feedback signal acquisition unit 62*a***.

The difference calculation unit **62*d* in the distortion compensation signal output unit 61 in the modem 1-*n* calculates a difference between the synthesized feedback signal and a base band signal output from the modulation unit 12 when the feedback signal synthesis unit 62*c*** synthesizes N feedback signals.

The PD signal generation unit 63 in the distortion compensation signal output unit 61 in the modem **1-*n* retains in advance a lookup table storing a distortion compensation coefficient corresponding to a difference between a base band signal and a synthesized feedback signal. The PD signal generation unit 63 reads out, from the lookup table, a distortion compensation coefficient corresponding to the difference calculated by the difference calculation unit 62*d* and outputs the predistortion signal representing the distortion compensation coefficient to the PD unit 13 in the modem 1-*n***.

In this second embodiment, the example in which the distortion compensation signal output unit 61 derives a predistortion signal in the LUT method is illustrated; however, a predistortion signal may be derived by another method such as the polynomial method or the memory polynomial method.

When receiving the predistortion signal from the distortion compensation signal output unit 61 in the modem **1-*n*, the PD unit 13 in the modem 1-*n* multiplies the base band signal output from the modulation unit 12 by the predistortion signal as described above, thereby compensating distortion of a radiation signal from the phased array antenna caused by non-linear operation of the power amplifier 43 mounted on the antenna module 4**.

FIGS. 9A to 9F are explanatory diagrams illustrating distortion compensation of a radiation signal of the phased array antenna by the PD units 13 of the modems 1-1 to 1-N.

FIG. 9A illustrates a required amplitude distribution given to the sixteen antenna modules 4.

In the example in FIG. 9A, the required amplitude distribution given to the sixteen antenna modules 4 are classified into three classes of 0 dB, −7.7 dB, and −15.3 dB. In the following, for convenience of explanation, the amplitude distribution of 0 dB is represented as a class A, the amplitude distribution of −7.7 dB as a class B, and the amplitude distribution of −15.3 dB as a class C.

In the example in FIG. 9A, four of the antenna modules 4 belong to the class A, eight of the antenna modules 4 belong to the class B, and four of the antenna modules 4 belong to the class C.

FIG. 9B is a diagram illustrating two-dimensional arrangement positions of the element antennas 47 in the antenna modules 4 of the systems (1) to (16).

FIG. 9C is a diagram illustrating input and output amplitude characteristics of the antenna modules 4 belonging to the classes A, B, and C. FIG. 9D is a diagram illustrating input and output phase characteristics of the antenna modules 4 belonging to the classes A, B, and C.

FIG. 9E is a diagram illustrating input and output amplitude characteristics obtained by synthesizing the input and output amplitude characteristics of the antenna modules 4 belonging to the classes A, B, and C. FIG. 9F is a diagram illustrating input and output phase characteristics obtained by synthesizing the input and output phase characteristics of the antenna modules 4 belonging to the classes A, B, and C.

In this second embodiment, the feedback signal synthesis unit **62*c* in the distortion compensation signal output unit 61 in the modem 1-*n* synthesizes feedback signals of the systems (1) to (16) and input and output amplitude characteristics of the synthesized feedback signal correspond to the input and output amplitude characteristics illustrated in FIG. 9E**.

Moreover, input and output phase characteristics of the synthesized feedback signal correspond to the input and output phase characteristics illustrated in FIG. 9E Therefore, a difference calculated by the difference calculation unit 62d in the distortion compensation signal output unit 61 in the modem 1-n, that is, a difference between the synthesized feedback signal and the base band signal output from the modulation unit 12 corresponds to a distortion component of a radiation signal of the phased array antenna formed by the sixteen element antennas 47.

As a result, it is possible to grasp distortion characteristics of a radiation signal of the phased array antenna from the difference calculated by the difference calculation unit 62d and derive a distortion compensation coefficient that provides distortion characteristics opposite to the distortion characteristics. By multiplying the base band signal output from the modulation unit 12 by a predistortion signal representing the distortion compensation coefficient by the PD unit 13, it is possible to compensate distortion of a signal radiated from the phased array antenna.

According to the above configuration, even when input and output amplitude and phase characteristics of an antenna module 4 in one of the systems are changed due to heat or other causes, for example, it is possible to grasp distortion characteristics of a radiation signal of the phased array antenna and derive a distortion compensation coefficient that provides distortion characteristics opposite to the distortion characteristics. Therefore, it is possible to correctly compensate distortion of a radiation signal of the phased array antenna.

Next, operations of receiving a signal will be described.

The switch 46 in the antenna module 4-n connects the element antenna 47 and a filter 49 when an RF signal is received and thus a reception signal of the element antenna 47 is fed to the filter 49.

The filter 49 in the antenna module 4-n reduces higher harmonics superimposed on the reception signal when receiving the reception signal from the switch 46, similarly to the first embodiment, and outputs the reception signal after reduction of the higher harmonics.

A low-noise amplifier 50 in the antenna module 4-n amplifies power of the reception signal when receiving the reception signal after reduction of the higher harmonics from the filter 49, similarly to the first embodiment, and outputs the reception signal after power amplification.

The switch 51 in the antenna module 4-n connects the low-noise amplifier 50 and the variable gain amplifier 52 when an RF signal is received and thus the reception signal after power amplification output from the low-noise amplifier 50 is fed to the variable gain amplifier 52.

The variable gain amplifier 52 in the antenna module 4-n adjusts the amplitude of the reception signal when receiving the reception signal from the switch 51 similarly to the first embodiment.

The phase shifter 53 in the antenna module 4-n adjusts the phase of the reception signal when receiving the reception signal after the amplitude adjustment from the variable gain amplifier 52 similarly to the first embodiment.

The phase shift amount of the reception signal added by the phase shifter 53 in the antenna module 4-n is determined such that the phase of the reception signal is synchronized with the phases of reception signals output from the other antenna modules 4.

The frequency conversion unit 25 in the signal conversion unit 2-n converts the frequency of the reception signal when receiving the reception signal after the phase adjustment from the phase shifter 53 in the antenna module 4-n and outputs the reception signal in the base band.

The ADC 26 in the signal conversion unit 2-n converts the reception signal from analog to digital when receiving the reception signal in the base band from the frequency conversion unit 25 and outputs the digital reception signal.

The switch 14 in the modem 1-n connects the ADC 26 and the demodulation unit 18 when an RF signal is received and thus the digital reception signal output from the ADC 26 is fed to the demodulation unit 18.

The demodulation unit 18 in the modem 1-n quadrature-demodulates the reception signal when receiving the digital reception signal from the switch 14 and outputs the reception signal after quadrature-demodulation to the DSP 11.

The DSP 11 in the modem 1-n performs predetermined digital signal processing on the reception signal when receiving the reception signal after quadrature-demodulation from the demodulation unit 18.

As can be understood clearly from the above, according to the second embodiment, the distortion compensation signal output unit 61 in the modem 1-n synthesizes feedback signals output from the ADCs 26 in the signal conversion units 2-1 to 2-N, derives, from a difference between the synthesized feedback signal and the base band signal output from the modulation unit 12, a distortion compensation coefficient that provides, to the base band signal, distortion characteristics opposite to distortion characteristics of a signal radiated from the phased array antenna and outputs a predistortion signal representing the distortion compensation coefficient to the PD unit 13. This achieves an effect of preventing occurrence of distortion, even when an amplitude distribution is given in order for the variable gain amplifier 42 in the antenna modules 4-n to suppress side lobes of an antenna pattern, up to output power equivalent to that in a case where an amplitude distribution is not given.

Third Embodiment

In the first embodiment, when an RF signal is transmitted, all of the antenna modules 4 included in each of the array antenna modules 3 output a feedback signal; however, only a part of the antenna modules 4 included in each of the array antenna modules 3 may output a feedback signal.

Figure 10:
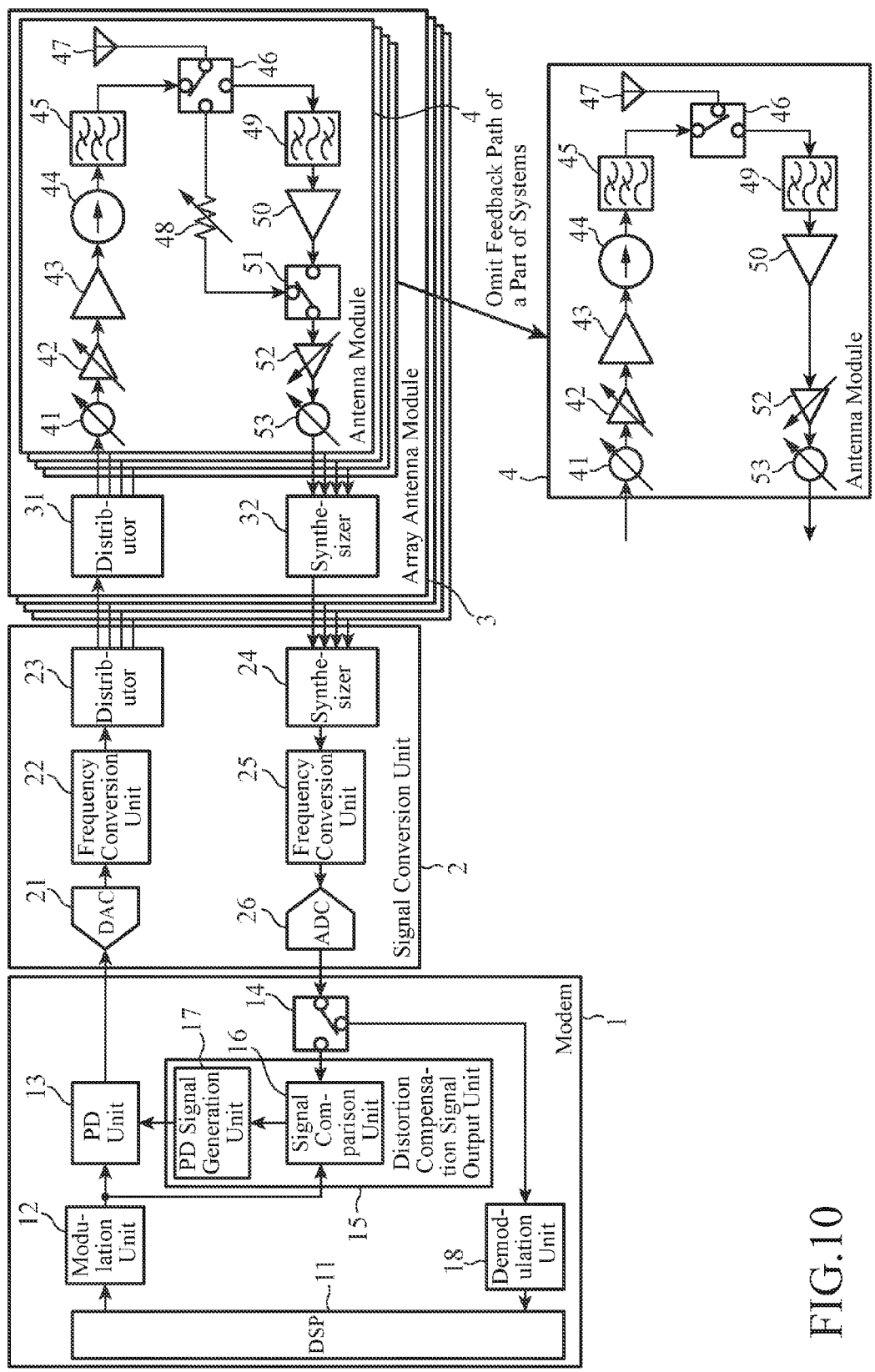
FIG. 10 is a configuration diagram illustrating a phased array antenna device according to a third embodiment of the invention.

FIG. 10 is a configuration diagram illustrating a phased array antenna device according to a third embodiment of the invention. In FIG. 10, the same symbols as those in FIG. 1 represent the same or corresponding parts and thus descriptions thereof are omitted.

In the example in FIG. 10, an antenna module 4 mounted with a variable attenuator 48 and a switch 51 and an antenna module 4 not mounted with a variable attenuator 48 and a switch 51 are included together.

That is, an antenna module 4 required to output a feedback signal is mounted with a variable attenuator 48 and a switch 51 while an antenna module 4 not required to output a feedback signal is not mounted with a variable attenuator 48 and a switch 51.

Specifically, when an amplitude distribution is given to respective antenna modules 4 by respective variable gain amplifiers 42 for the purpose of suppressing side lobes of an antenna pattern of a phased array antenna, the antenna modules 4 are classified into grouped in accordance with the amplitude distribution given thereto. A representative antenna module from among one or more antenna modules belonging to a group of the same amplitude distribution is mounted with a variable attenuator 48 and a switch 51 in order to output a feedback signal after amplitude and phase adjustment while an antenna module other than the representative antenna module does not output a feedback signal and thus is not mounted with a variable attenuator 48 and a switch 51.

FIG. 10 illustrates an example in which an antenna module 4 not required to output a feedback signal is not mounted with a variable attenuator 48 and a switch 51; however, a variable attenuator 48 and a switch 51 may be mounted like an antenna module 4 required to output a feedback signal. In such a case, an output of a feedback signal is prevented by adjusting attenuation amount of the variable attenuator 48.

In the third embodiment, it is assumed for convenience of explanation that element antennas 47 in the antenna modules 4 of the systems (1) to (16) are arranged as illustrated in FIG. 9B and the required amplitude distribution is given to the antenna modules 4 of the systems (1) to (16) as illustrated in FIG. 9A.

Therefore, for example, in four array antenna modules 3, when a first array antenna module 3 is mounted with antenna modules 4 of the systems (1) to (4), a second array antenna module 3 is mounted with antenna modules 4 of the systems (5) to (8), a third array antenna module 3 is mounted with antenna modules 4 of the systems (9) to (12), and a fourth array antenna module 3 is mounted with antenna modules 4 of the systems (13) to (16), each of the first to fourth array antenna modules 3 is mounted with one antenna module 4 belonging to the class A, two antenna modules 4 belonging to the class B, and one antenna module 4 belonging to the class C.

The four antenna modules 4 belonging to the class A, that is, the antenna modules 4 in the systems (4), (7), (10), and (13) are classified into a first group. The eight antenna modules 4 belonging to the class B, that is, the antenna modules 4 in the systems (2), (3), (5), (8), (9), (12), (14), and (15) are classified into a second group. The four antenna modules 4 belonging to the class C, that is, the antenna modules 4 in the systems (1), (6), (11), and (16) are classified into a third group.

A plurality of antenna modules 4 belonging to the same group is given the same amplitude distribution and thus the amplitude and phase characteristics of feedback signals output from the plurality of antenna modules 4 are substantially the same.

Therefore, when any one or more antenna modules 4 of the plurality of antenna modules 4 belonging to the same group are regarded as representative antenna modules 4 and the representative antenna modules 4 output a feedback signal, the feedback signals can be regarded as feedback signals output from the other antenna modules 4.

Therefore, when the representative antenna modules 4 is configured to output a feedback signal, even when the other antenna modules 4 do not output a feedback signal, feedback signals output from the sixteen antenna modules 4 can be synthesized similarly to the first embodiment.

In this third embodiment, therefore, the antenna module 4 of the system (4) is regarded as a representative antenna module 4, for example, out of the four antenna modules 4 belonging to the first group.

The antenna modules 4 of the systems (2) and (3) are regarded as representative antenna modules 4, for example, out of the eight antenna modules 4 belonging to the second group. The antenna module 4 of the system (1) is regarded as a representative antenna module 4, for example, out of the four antenna modules 4 belonging to the third group.

In this case, each of the antenna modules 4 of the systems (1) to (4) is mounted with a variable attenuator 48 and a switch 51 to enable outputting a feedback signal after amplitude and phase adjustment.

The antenna modules 4 of the other systems (5) to (16) are not mounted with a variable attenuator 48 and a switch 51 and do not output a feedback signal after amplitude and phase adjustment.

As a result of this, synthesizers 32 in array antenna modules 3 and a synthesizer 24 in a signal conversion unit 2 synthesize feedback signals output from the antenna modules 4 of the systems (1) to (4). The synthesized feedback signal is output to a signal comparison unit 16 in a distortion compensation signal output unit 15 via a frequency conversion unit 25, an ADC 26, and a switch 14.

The synthesized feedback signal provided to the signal comparison unit 16 in the distortion compensation signal output unit 15 is a synthesized result of a feedback signal from the one antenna module 4 belonging to the class A, feedback signals from the two antenna modules 4 belonging to the class B, and a feedback signal from the one antenna module 4 belonging to the class C. This has the same ratio of the amplitude distribution, that is, the ratio of the classes A, B, and C as the case of synthesizing sixteen feedback signals and thus the same synthesized feedback signal as the case of synthesizing sixteen feedback signals is provided.

The contents of processing by the distortion compensation signal output unit 15 and the PD unit 13 are similar to those of the first embodiment and thus detailed descriptions thereof are omitted.

As can be understood clearly from the above, according to the third embodiment, the plurality of antenna modules 4 are classified into groups in accordance with amplitude distribution given thereto for the purpose of suppressing side lobes of an antenna pattern in the phased array antenna. A representative antenna module from among one or more antenna modules 4 belonging to a group of the same amplitude distribution outputs a feedback signal after amplitude and phase adjustment while the antenna module 4 other than the representative antenna module 4 does not output a feedback signal. By this configuration, it is possible to obtain effects similar to those of the first embodiment as well as effects of simplifying the configuration of the antenna module 4 other than the representative antenna module 4.

Fourth Embodiment

In a fourth embodiment respective antenna modules 4 are classified in accordance with amplitude distribution, like the third embodiment. In addition, a plurality of groups are further classified in accordance with the degree of influence on distortion characteristics of a signal radiated from a phased array antenna.

In the fourth embodiment, descriptions are given that, from among the plurality of groups, an antenna module belonging to a group having relatively high degree of influence as compared to other groups outputs a feedback signal after amplitude and phase adjustment while an antenna module belonging to a group having relatively low degree of influence as compared to other groups does not output a feedback signal.

Figure 11:
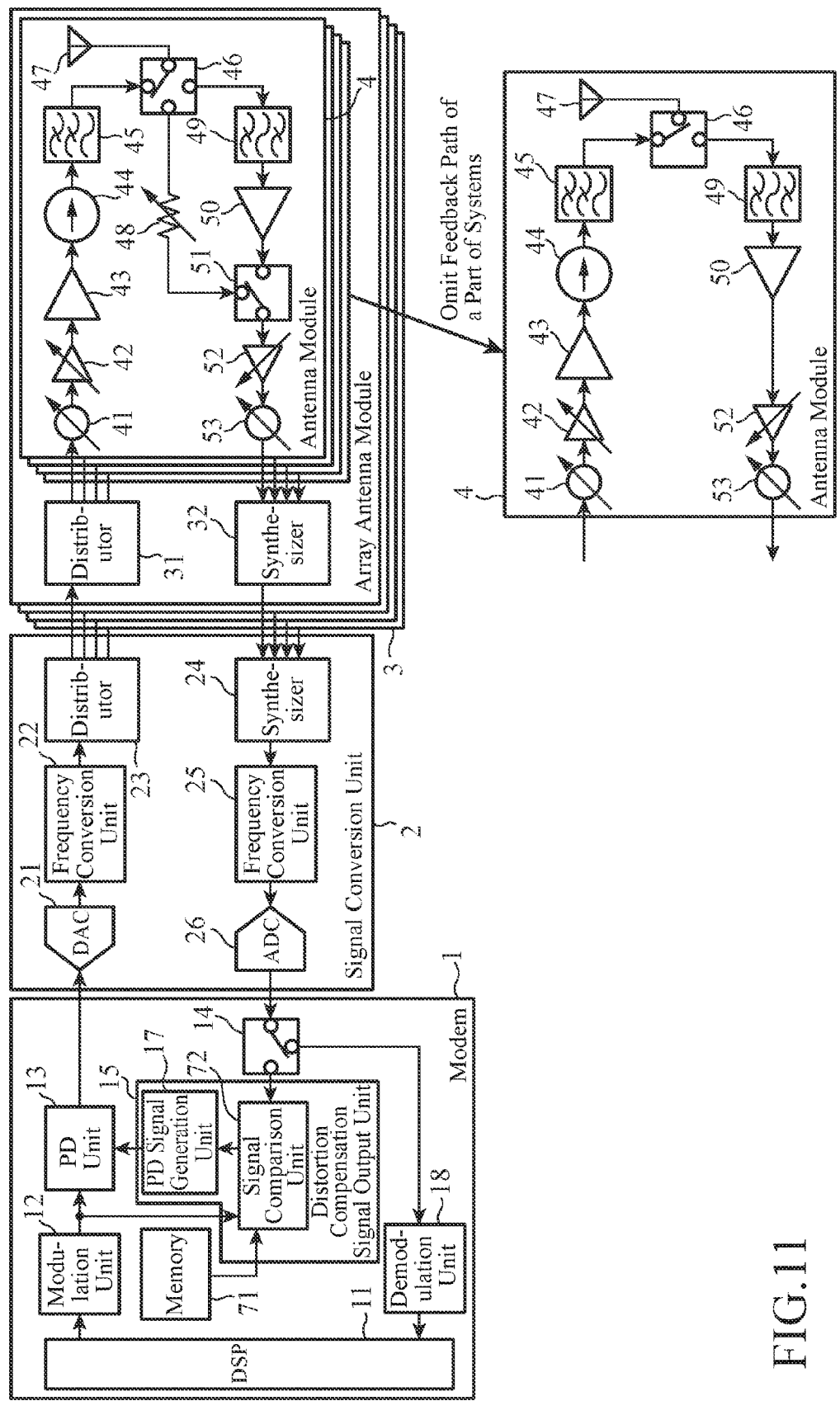
FIG. 11 is a configuration diagram illustrating a phased array antenna device according to a fourth embodiment of the invention.

FIG. 11 is a configuration diagram illustrating a phased array antenna device according to the fourth embodiment of the invention. In FIG. 11, the same symbols as those in FIG. 1 represent the same or corresponding parts and thus descriptions thereof are omitted.

A modem 1 is mounted with a memory 71. A distortion compensation signal output unit 15 includes a signal comparison unit 72 and a PD signal generation unit 17.

The memory 71 and the signal comparison unit 72 will be described later.

In the example in FIG. 11, an antenna module 4 mounted with a variable attenuator 48 and a switch 51 and an antenna module 4 not mounted with a variable attenuator 48 and a switch 51 are included together.

That is, an antenna module 4 required to output a feedback signal is mounted with a variable attenuator 48 and a switch 51 while an antenna module 4 not required to output a feedback signal is not mounted with a variable attenuator 48 and a switch 51.

FIG. 12 is an explanatory diagram illustrating deterioration of distortion compensation amount due to amplitude variance of the respective systems with respect to a certain distortion value.

In FIG. 12, numbers (1) to (18) represent combinations of amplitude variance of the antenna modules 4 belonging to the classes A, B, and C.

In FIG. 12, an improvement amount of B. O. and a deterioration amount are shown for every combination of amplitude variance.

Amplitude variance is represented in dB. When amplitude variance is 0 dB, the space is left blank.

The B. O. improvement amount represents how many decibels of output power of the phased array antenna are improved when distortion compensation processing is performed on a certain distortion value as compared to a case where no distortion compensation processing is performed.

The deterioration amount represents how many decibels are deteriorated when distortion compensation processing on a certain distortion value is not ideal.

For example, if it is assumed that a deterioration amount of up to 2 dB is allowed when amplitude variance of the combination number (1) occurs, by adjusting amplitude variance of the antenna modules 4 belonging to the classes A, B, and C to the combination (2) or (3), the deterioration amount is reduced from 4.3 dB to 1 dB or 0.3 dB, and as a result, a deterioration amount is suppressed to be within an acceptable range.

However, if the amplitude variance of the antenna module 4 belonging to the class A is adjusted, even when the amplitude variance of the antenna modules 4 belonging to the classes B and C is not adjusted, it is possible to suppress the deterioration amount to be within the acceptable range as illustrated by a combination number (16).

Note that, the antenna modules 4 belonging to the class A have relatively high influence on distortion characteristics of a signal radiated from the phased array antenna as compared to the antenna modules 4 belonging to the classes B and C, and thus, by merely adjusting amplitude variance of the antenna modules 4 belonging to the class A, the deterioration amount can be suppressed to be within the acceptable range. On the other hand, the antenna modules 4 belonging to the classes B and C have relatively low influence on distortion characteristics as compared to the antenna modules 4 belonging to the class A, and thus, by merely adjusting amplitude variance of the antenna modules 4 belonging to the class B, it may not be possible to suppress the deterioration amount to be within the acceptable range. Moreover, by merely adjusting amplitude variance of the antenna modules 4 belonging to the class C, it may not be possible to suppress the deterioration amount to be within the acceptable range as illustrated by a combination number (13).

In this fourth embodiment, therefore, each of the four antenna modules 4 belonging to the class A having high influence on distortion characteristics, that is, each of the antenna modules of the systems (4), (7), (10), and (13) is mounted with a variable attenuator 48 and a switch 51 to enable outputting a feedback signal after amplitude and phase adjustment.

On the other hand, each of the twelve antenna modules 4 belonging to the classes B and C having low influence on distortion characteristics, that is, each of the antenna modules of the systems (1) to (3), (5), (6), (8), (9), (11), (12), and (14) to (16) is not mounted with a variable attenuator 48 and a switch 51 and does not output a feedback signal after amplitude and phase adjustment.

As a result of this, synthesizers 32 in the array antenna modules 3 and a synthesizer 24 in a signal conversion unit 2 synthesize feedback signals output from the antenna modules 4 of the systems (4), (7), (10), and (13). The synthesized feedback signal is output to the signal comparison unit 72 in the distortion compensation signal output unit 15 via a frequency conversion unit 25, an ADC 26, and a switch 14.

In the fourth embodiment, the twelve antenna modules 4 belonging to the classes B and C having low influence on distortion characteristics do not output a feedback signal and thus, for example, feedback signals output from the twelve antenna modules 4 belonging to the classes B and C which are measured upon product test are stored in the memory 71 in the modem 1. These feedback signals are referred to as "fixed feedback signal" hereinbelow since they do not change even when input and output amplitude and phase characteristics of the antenna modules 4 belonging to the classes B and C change due to heat or other causes.

When receiving a synthesized feedback signal of the systems (4), (7), (10), and (13) from the ADC 26 via the switch 14, the signal comparison unit 72 in the distortion compensation signal output unit 15 synthesizes the feedback signal and the feedback signals stored in the memory 71.

That is, the signal comparison unit 72 synthesizes feedback signals from the four antenna modules 4 belonging to the class A and output from the ADC 26 via the switch 14, fixed feedback signals from the eight antenna modules 4 belonging to the class B stored in the memory 71, and fixed feedback signals from the four antenna modules 4 belonging to the class C stored in the memory 71, thereby generating a synthesized feedback signal that corresponds to a synthesized feedback signal when feedback signals output from the sixteen antenna modules 4 are synthesized.

After generating the synthesized feedback signal, the signal comparison unit 72 in the distortion compensation signal output unit 15 calculates a difference between the synthesized feedback signal and a base band signal output from the modulation unit 12.

The PD signal generation unit 17 in the distortion compensation signal output unit 15 retains in advance a lookup table storing a distortion compensation coefficient corresponding to a difference between a base band signal and a feedback signal. The PD signal generation unit 17 reads out, from the lookup table, a distortion compensation coefficient corresponding to the difference calculated by the signal comparison unit 72 and outputs the predistortion signal representing the distortion compensation coefficient to the PD unit 13.

The contents of processing by the PD unit 13 are similar to those of the first embodiment and thus detailed descriptions thereof are omitted.

As can be understood clearly from the above, according to the fourth embodiment, the plurality of groups are classified in accordance with the degree of influence on distortion characteristics of a signal radiated from the phased array antenna and, from among the plurality of groups, an antenna module belonging to a group having relatively high influence as compared to other groups outputs a feedback signal after amplitude and phase adjustment while an antenna module belonging to a group having relatively low influence as compared to other groups does not output a feedback signal. By this configuration, it is possible to obtain effects similar to those of the first embodiment as well as effects of simplifying the configuration of the antenna module 4 belonging to the group having a low influence on distortion characteristics.

Fifth Embodiment

In the second embodiment, when an RF signal is transmitted, all of the antenna modules 4 output a feedback signal; however, only a part of the antenna modules 4 may output a feedback signal.

Figure 13:
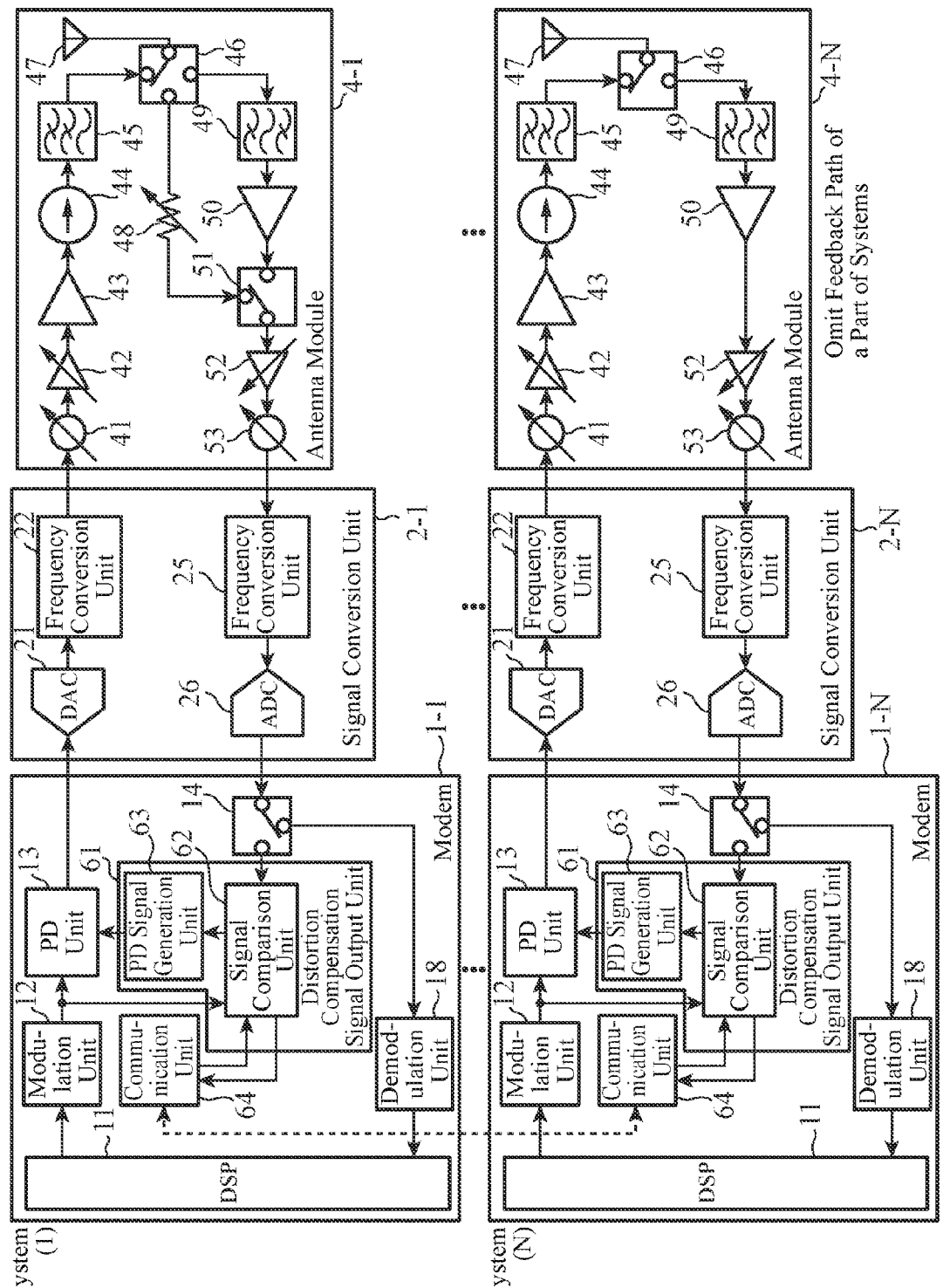
FIG. 13 is a configuration diagram illustrating a phased array antenna device according to a fifth embodiment of the invention.

FIG. 13 is a configuration diagram illustrating a phased array antenna device according to a fifth embodiment of the invention. In FIG. 13, the same symbols as those in FIG. 7 represent the same or corresponding parts and thus descriptions thereof are omitted.

In the example in FIG. 13, an antenna module 4 mounted with a variable attenuator 48 and a switch 51 and an antenna module 4 not mounted with a variable attenuator 48 and a switch 51 are included together.

That is, an antenna module 4 required to output a feedback signal is mounted with a variable attenuator 48 and a switch 51 while an antenna module 4 not required to output a feedback signal is not mounted with a variable attenuator 48 and a switch 51.

The example in FIG. 13 illustrates an antenna module 4-1 mounted with a variable attenuator 48 and a switch 51 and an antenna module 4-N not mounted with the variable attenuator 48 and the switch 51 for convenience of explanation; however, this is merely an example. The antenna module 4-1 may not be mounted with the variable attenuator 48 and the switch 51 while the antenna module 4-N may be mounted with the variable attenuator 48 and the switch 51.

Specifically, similarly to the third embodiment described before, the following configuration is assumed: each of antenna modules 4-1 to 4-4 of systems (1) to (4) is mounted with the variable attenuator 48 and the switch 51 while antenna modules 4-5 to 4-16 of systems (5) to (16) are not mounted with the variable attenuator 48 and the switch 51.

In the configuration in which each of the antenna modules 4-1 to 4-4 of the systems (1) to (4) is mounted with the variable attenuator 48 and the switch 51 while antenna modules 4-5 to 4-16 of the systems (5) to (16) are not mounted with the variable attenuator 48 and the switch 51, each of modems 1-1 to 1-4 of the systems (1) to (4) is fed with a feedback signal from the antenna modules 4-1 to 4-4 via signal conversion units 2-1 to 2-4, respectively.

Each of communication units 64 of the modems 1-1 to 1-4 of the systems (1) to (4) transmits a feedback signal output from each of the antenna module 4-1 to 4-4 to the communication units 64 of the other systems.

Communication units 64 of modems 1-5 to 1-16 of the systems (5) to (16) do not transmit a feedback signal to the communication units 64 of the other systems since no feedback signal is output from the antenna modules 4-5 to 4-16.

The communication unit 64 in each of the modems 1-1 to 1-4 of the systems (1) to (4) receives three feedback signals transmitted from the communication units 64 in the other systems and stores the three feedback signals in a feedback signal storage unit 62b.

The communication unit 64 in each of the modems 1-5 to 1-16 of the systems (5) to (16) receives four feedback signals transmitted from the communication units 64 of the systems (1) to (4) and stores the four feedback signals in the feedback signal storage unit 62b.

Each of feedback signal synthesis units 62c in a distortion compensation signal output units 61 of the systems (1) to (4) reads out three feedback signals of other systems from the feedback signal storage unit 62b. For example, the feedback signal synthesis unit 62c of the system (1) reads out three feedback signals output from the antenna modules 4-2 to 4-4 of the systems (2) to (4). The feedback signal synthesis unit 62c of the system (2) reads out three feedback signals output from the antenna modules 4-1, 4-3, and 4-4 of the systems (1), (3), and (4).

The feedback signal synthesis unit 62c of the systems (1) to (4) synthesizes the read out three feedback signals and the feedback signal output from a feedback signal acquisition unit 62a.

When the feedback signal synthesis unit 62c synthesizes the four feedback signals, each of difference calculation units 62d in the distortion compensation signal output units 61 of the systems (1) to (4) calculates a difference between the synthesized feedback signal and a base band signal output from the modulation unit 12.

Each of the feedback signal synthesis units 62c in the distortion compensation signal output units 61 of the systems (5) to (16) reads out feedback signals of the systems (1) to (4) from the feedback signal storage unit 62b and synthesizes the feedback signal of the systems (1) to (4).

When the feedback signal synthesis unit 62c synthesizes the four feedback signals, each of the difference calculation units 62d in the distortion compensation signal output units 61 of the systems (1) to (16) calculates a difference between the synthesized feedback signal and a base band signal output from the modulation unit 12.

The contents of processing by a PD signal generation unit 63 in the distortion compensation signal output unit 61 and a PD unit 13 in the modem 1-n are similar to those of the second embodiment and thus detailed descriptions thereof are omitted.

As can be understood clearly from the above, according to the fifth embodiment, the plurality of antenna modules 4 are classified into groups in accordance with amplitude distribution given for the purpose of suppressing side lobes of an antenna pattern in the phased array antenna. A representative antenna module from among one or more antenna modules 4 belonging to a group of the same amplitude distribution outputs a feedback signal after amplitude and phase adjustment while the antenna module 4 other than the representative antenna module 4 does not output a feedback signal. By this configuration, it is possible to obtain effects similar to those of the second embodiment as well as effects of simplifying the configuration of the antenna module 4 other than the representative antenna module 4.

Sixth Embodiment

In a sixth embodiment, similarly to the fourth embodiment, respective antenna modules 4 are classified into groups in accordance with amplitude distribution, and the groups are further classified in accordance with the degree of influence on distortion characteristics of a signal radiated from a phased array antenna.

In the sixth embodiment, descriptions are given that, from among the plurality of groups, an antenna module belonging to a group having relatively high degree of influence as compared to other groups outputs a feedback signal after amplitude and phase adjustment while an antenna module belonging to a group having relatively low degree of influence as compared to other groups does not output a feedback signal.

A configuration diagram of a phased array antenna device according to the sixth embodiment is similar to that in FIG. 13 of the fifth embodiment.

Figure 14:
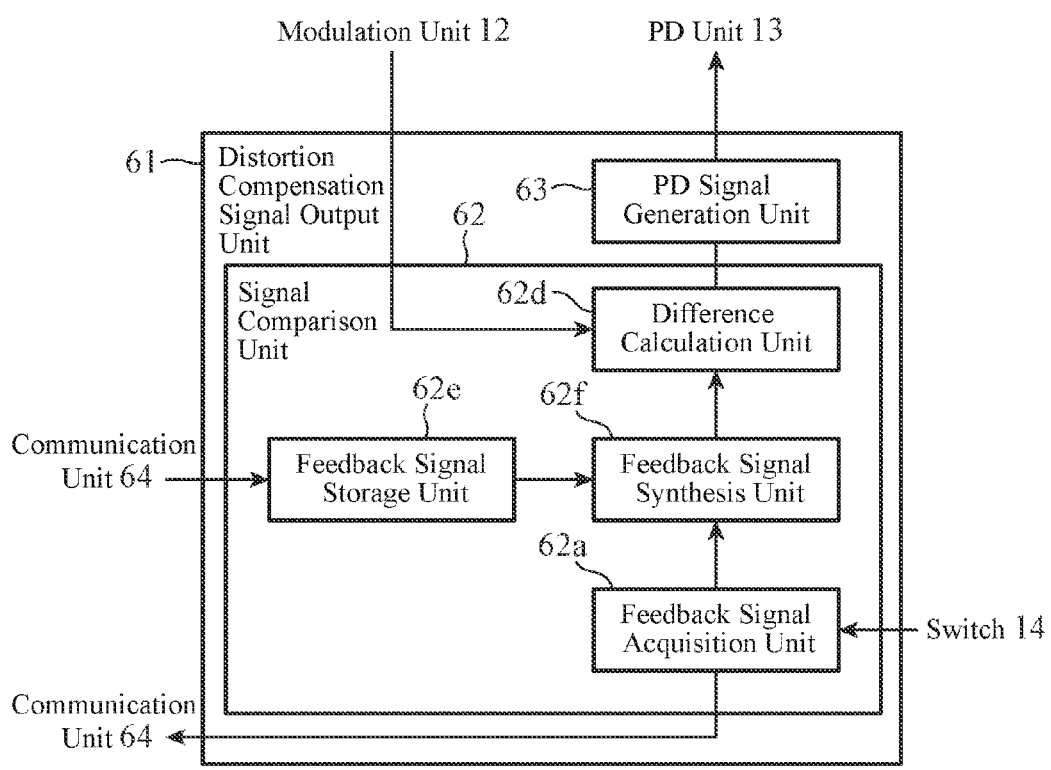
FIG. 14 is a configuration diagram illustrating a distortion compensation signal output unit 61 in a modem 1-$n$ of a phased array antenna device according to a sixth embodiment of the invention.

FIG. 14 is a configuration diagram illustrating a distortion compensation signal output unit 61 in a modem 1-n of the phased array antenna device according to the sixth embodiment of the invention. In FIG. 14, the same symbols as those in FIG. 8 represent the same or corresponding parts and thus descriptions thereof are omitted.

A feedback signal storage unit 62e stores feedback signals of the other systems received by a communication unit 64 as well as fixed feedback signals from antenna modules 4 not mounted with a variable attenuator 48 and a switch 51.

A feedback signal synthesis unit 62f synthesizes the feedback signal output from a feedback signal acquisition unit 62a and the feedback signals of the other systems and the fixed feedback signals stored in a feedback signal storage unit 62b.

In the sixth embodiment, similarly to the fourth embodiment described above, an antenna module 4 mounted with a variable attenuator 48 and a switch 51 and an antenna module 4 not mounted with a variable attenuator 48 and a switch 51 are included together.

Specifically the following configuration is assumed similarly to the fourth embodiment: each of four antenna modules 4 belonging to the class A having high influence on distortion characteristics, that is, antenna modules 4 of the systems (4), (7), (10), and (13), are mounted with a variable attenuator 48 and a switch 51 while each of twelve antenna modules 4 belonging to the classes B and C having low influence on distortion characteristics, that is, antenna modules 4 of the systems (1) to (3), (5), (6), (8), (9), (11), (12), and (14) to (16) is not mounted with a variable attenuator 48 and a switch 51.

In the configuration in which each of the antenna modules 4 of the systems (4), (7), (10), and (13) is mounted with the variable attenuator 48 and the switch 51 while antenna modules 4 of the systems (1) to (3), (5), (6), (8), (9), (11), (12), and (14) to (16) are not mounted with the variable attenuator 48 and the switch 51, each of modems 1 of the systems (4), (7), (10), and (13) is fed with a feedback signal from the antenna module 4 connected thereto via the signal conversion unit 2.

Each of the communication units 64 in the modems 1 of the systems (4), (7), (10), and (13) transmits a feedback signal output from the antenna module 4 connected thereto to the communication units 64 of the other systems.

The communication units 64 in the modems 1 of the systems (1) to (3), (5), (6), (8), (9), (11), (12), and (14) to (16) do not transmit a feedback signal to the communication units 64 of the other systems since no feedback signal is output thereto from the antenna module 4 connected thereto.

The communication unit 64 in the modem 1 of each of the systems (4), (7), (10), and (13) receives three feedback signals transmitted from the communication units 64 in the other systems and stores the three feedback signals in the feedback signal storage unit 62e.

The communication unit 64 in the modem 1 of each of the systems (1) to (3), (5), (6), (8), (9), (11), (12), and (14) to (16) receives four feedback signals transmitted from the communication units 64 of the systems (4), (7), (10), and (13) and stores the four feedback signals in the feedback signal storage unit 62e.

The feedback signal synthesis units 62f in the distortion compensation signal output units 61 in the systems (4), (7), (10), and (13) read out the three feedback signals of the other systems from the feedback signal storage units 62e and read out fixed feedback signals of the systems (1) to (3), (5), (6), (8), (9), (11), (12), and (14) to (16) from the feedback signal storage units 62e.

For example, the feedback signal synthesis unit 62f of the system (4) reads out three feedback signals output from the antenna modules 4 of the systems (7), (10), and (13) and reads out fixed feedback signals of the systems (1) to (3), (5), (6), (8), (9), (11), (12), and (14) to (16). The feedback signal synthesis unit 62f of the system (7) reads out three feedback signals output from the antenna modules 4 of the systems (4), (10), and (13) and reads out fixed feedback signals of the systems (1) to (3), (5), (6), (8), (9), (11), (12), and (14) to (16).

Each of the feedback signal synthesis units 62f of the systems (4), (7), (10), and (13) synthesizes the three read-out feedback signals, the read-out fixed feedback signals, and a feedback signal of an antenna module 4 connected thereto and output from the feedback signal acquisition unit 62a.

The feedback signal synthesis unit 62f in the distortion compensation signal output unit 61 in the systems (1) to (3), (5), (6), (8), (9), (11), (12), and (14) to (16) reads out the four feedback signals of the systems (4), (7), (10), and (13) from the feedback signal storage unit 62e and reads out fixed feedback signals of the systems (1) to (3), (5), (6), (8), (9), (11), (12), and (14) to (16) from the feedback signal storage unit 62e.

Each of the feedback signal synthesis units 62f of the systems (1) to (3), (5), (6), (8), (9), (11), (12), and (14) to (16) synthesizes the read-out four feedback signals and the read-out fixed feedback signals.

The difference calculation unit 62d in the distortion compensation signal output unit 61 of the systems (1) to (16) calculates a difference between the synthesized feedback signal and a base band signal output from the modulation unit 12 when the feedback signal synthesis unit 62f synthesizes the sixteen feedback signals.

The contents of processing by a PD signal generation unit 63 in the distortion compensation signal output unit 61 and a PD unit 13 in the modem 1-n are similar to those of the second embodiment and thus detailed descriptions thereof are omitted.

As can be understood clearly from the above, according to the sixth embodiment, the plurality of groups are classified in accordance with the degree of influence on distortion characteristics of a signal radiated from the phased array antenna and, from among the plurality of groups, an antenna module belonging to a group having relatively high influence as compared to other groups outputs a feedback signal after amplitude and phase adjustment while an antenna module belonging to a group having relatively low influence as compared to other groups does not output a feedback signal. By this configuration, it is possible to obtain effects similar to those of the second embodiment as well as effects of simplifying the configuration of the antenna module 4 belonging to the group having a low influence on distortion characteristics.

Incidentally, within the scope of the present invention, the present invention may include a flexible combination of respective embodiments, a modification or omission of any component of the respective embodiments.

INDUSTRIAL APPLICABILITY

A phased array antenna device includes: a distortion compensation unit compensating distortion of a signal radiated from a phased array antenna by performing distortion compensation processing on a transmission signal using a distortion compensation coefficient; a distribution unit distributing the transmission signal to which the distortion compensation processing is performed by the distortion compensation unit; a plurality of antenna modules performing signal processing of: performing adjustment of an amplitude and a phase of the transmission signal distributed by the distribution unit; and amplifying power of the transmission signal, and thereby radiating the transmission signal after the signal processing from an element antenna forming the phased array antenna, and performing adjustment of an amplitude and a phase of a feedback signal by using a part of the transmission signal after the signal processing as the feedback signal and outputting the feedback signal which is adjusted by the adjustment of the amplitude and the phase of the feedback signal; a synthesis unit synthesizing feedback signals each of which is output from each of the plurality of antenna modules to generate a synthesized feedback signal. A distortion compensation signal output unit derives, from a difference between the synthesized feedback signal synthesized by the synthesis unit and the transmission signal before the distortion compensation processing by the distortion compensation unit, a distortion compensation coefficient that provides, to the transmission signal, distortion characteristics to be opposite to distortion characteristics of a signal radiated from the phased array antenna and outputs the distortion compensation coefficient to the distortion compensation unit. As a result, the phased array antenna device according to this invention is capable of preventing, even when an amplitude distribution is given, occurrence of distortion up to output power equivalent to that in a case where an amplitude distribution is not given and thus is suitable for compensating nonlinearity of a signal in a power amplifier that amplifies a modulated wave signal.

REFERENCE SIGNS LIST 1, 1-*n* modem
2, 2-*n* signal conversion unit
3 array antenna module
4, 4-*n* antenna module
11 DSP
12 modulation unit
13 PD unit (distortion compensation unit)
14 switch
15 distortion compensation signal output unit
16 signal comparison unit
17 PD signal generation unit
18 demodulation unit
21 DAC
22 frequency conversion unit
23 distributor (distribution unit)
24 synthesizer (synthesis unit)
25 frequency conversion unit
26 ADC
31 distributor (distribution unit)
32 synthesizer (synthesis unit)
41 phase shifter
42 variable gain amplifier
43 power amplifier
44 isolator
45 filter
46 switch
47 element antenna
48 variable attenuator
49 filter
50 low-noise amplifier
51 switch
52 variable gain amplifier
53 phase shifter
61 distortion compensation signal output unit
62 signal comparison unit
62*a* feedback signal acquisition unit
62*b* feedback signal storage unit
62*c* feedback signal synthesis unit
62*d* difference calculation unit
62*e* feedback signal storage unit
62*f* feedback signal synthesis unit
63 PD signal generation unit
64 communication unit
71 memory
72 signal comparison unit

The invention claimed is:
1. A phased array antenna device, comprising:
a distortion compensation unit compensating distortion of a signal radiated from a phased array antenna by performing distortion compensation processing on a transmission signal using a distortion compensation coefficient;
a distribution unit distributing the transmission signal to which the distortion compensation processing is performed by the distortion compensation unit;
a plurality of antenna modules performing signal processing of: performing adjustment of an amplitude and a phase of the transmission signal distributed by the distribution unit; and amplifying power of the transmission signal, and thereby radiating the transmission signal after the signal processing from an element antenna forming the phased array antenna, and performing adjustment of an amplitude and a phase of a feedback signal by using a part of the transmission signal after the signal processing as the feedback signal such that the phases of feedback signals, each of which is the feedback signal of each of the plurality of antenna modules, is synchronized with each other, and outputting the feedback signal which is adjusted by the adjustment of the amplitude and the phase of the feedback signal;
a synthesis unit synthesizing feedback signals each of which is output from each of the plurality of antenna modules to generate a synthesized feedback signal; and
a distortion compensation signal output unit deriving, from a difference between the synthesized feedback signal synthesized by the synthesis unit and the transmission signal before the distortion compensation processing by the distortion compensation unit, a distortion compensation coefficient that provides, to the transmission signal, distortion characteristics to be opposite to distortion characteristics of a signal radiated from the phased array antenna and outputting the distortion compensation coefficient to the distortion compensation unit,
wherein the plurality of antenna modules is classified into a plurality of groups in accordance with amplitude distribution provided to suppress side lobes of an antenna pattern in the phased array antenna, and
a representative antenna module from among one or more antenna modules belonging to a group having a same amplitude distribution among the plurality of groups outputs the feedback signal after the adjustment of the amplitude and the phase to the synthesis unit, and an antenna module other than the representative antenna module does not output the feedback signal to the synthesis unit.

2. A phased array antenna device comprising:

a distortion compensation unit compensating distortion of a signal radiated from a phased array antenna by performing distortion compensation processing on a transmission signal using a distortion compensation coefficient;

a distribution unit distributing the transmission signal to which the distortion compensation processing is performed by the distortion compensation unit;

a plurality of antenna modules performing signal processing of: performing adjustment of an amplitude and a phase of the transmission signal distributed by the distribution unit and amplifying power of the transmission signal, and thereby radiating the transmission signal after the signal processing from an element antenna forming the phased array antenna, and performing adjustment of an amplitude and a phase of a feedback signal by using a part of the transmission signal after the signal processing as the feedback signal such that the phases of feedback signals, each of which is the feedback signal of each of the plurality of antenna modules, is synchronized with each other, and outputting the feedback signal which is adjusted by the adjustment of the amplitude and the phase of the feedback signal;

a synthesis unit synthesizing feedback signals each of which is output from each of the plurality of antenna modules to generate a synthesized feedback signal; and a distortion compensation signal output unit deriving, from a difference between the synthesized feedback signal synthesized by the synthesis unit and the transmission signal before the distortion compensation processing by the distortion compensation unit, a distortion compensation coefficient that provides, to the transmission signal, distortion characteristics to be opposite to distortion characteristics of a signal radiated from the phased array antenna and outputting the distortion compensation coefficient to the distortion compensation unit, wherein the plurality of antenna modules is classified into a plurality of groups in accordance with amplitude distribution provided to suppress side lobes of an antenna pattern in the phased array antenna, and the plurality of groups is further classified in accordance with a degree of influence on distortion characteristics of a signal radiated from the phased array antenna, and from among the plurality of groups, an antenna module belonging to a group having the degree of influence being relatively high as compared to other groups outputs the feedback signal after the adjustment of the amplitude and the phase to the synthesis unit, and an antenna module belonging to a group having the degree of influence being relatively low as compared to other groups does not output the feedback signal to the synthesis unit.

3. The phased array antenna device according to claim 1, wherein each of the plurality of antenna modules performs adjustment of an amplitude and a phase of a reception signal received by the element antenna and outputs the reception signal after the adjustment of the amplitude and the phase of the reception signal, and the synthesis unit synthesizes the reception signal output from each of the plurality of antenna modules.

4. A phased array antenna device comprising:

a plurality of distortion compensation units compensating distortion of a signal radiated from a phased array antenna by performing distortion compensation processing on a transmission signal using a distortion compensation coefficient;

a plurality of antenna modules performing signal processing of: performing adjustment of an amplitude and a phase of a transmission signal to which the distortion compensation processing is performed by the distortion compensation unit; and amplifying power of the transmission signal, and thereby radiating the transmission signal after the signal processing from an element antenna forming the phased array antenna, and performing adjustment of an amplitude and a phase of a feedback signal by using a part of the transmission signal after the signal processing as the feedback signal such that the phases of feedback signals, each of which is the feedback signal of each of the plurality of antenna modules, is synchronized with each other, and outputting the feedback signal which is adjusted by the adjustment of the amplitude and the phase of the feedback signal;

a plurality of distortion compensation signal output units synthesizing feedback signals each of which is output from each of the plurality of antenna modules to generate a synthesized feedback signal, deriving, from a difference between the synthesized feedback signal and the transmission signal before the distortion compensation processing by the plurality of distortion compensation units, a distortion compensation coefficient that provides, to the transmission signal, distortion characteristics to be opposite to distortion characteristics of a signal radiated from the phased array antenna and outputting the distortion compensation coefficient to the distortion compensation unit, wherein the plurality of antenna modules is classified into a plurality of groups in accordance with amplitude distribution provided to suppress side lobes of an antenna pattern in the phased array antenna, and a representative antenna module from among one or more antenna modules belonging to a group having a same amplitude distribution among the plurality of groups outputs the feedback signal after the adjustment of the amplitude and the phase to the distortion compensation unit, and an antenna module other than the representative antenna module does not output a feedback signal to the distortion compensation unit.

5. The phased array antenna device according to claim 4, wherein each of the plurality of antenna modules performs adjustment of an amplitude and a phase of a signal received by the element antenna and outputs the reception signal after the adjustment of the amplitude and the phase of the reception signal.

6. The phased array antenna device according to claim 2, wherein each of the plurality of antenna modules performs adjustment of an amplitude and a phase of a reception signal received by the element antenna and outputs the reception signal after the adjustment of the amplitude and the phase of the reception signal, and the synthesis unit synthesizes the reception signal output from each of the plurality of antenna modules.

* * * * *